(12) United States Patent
Tawara et al.

(10) Patent No.: US 12,249,625 B2
(45) Date of Patent: Mar. 11, 2025

(54) SILICON CARBIDE SEMICONDUCTOR DEVICE AND METHOD OF MANUFACTURING SILICON CARBIDE SEMICONDUCTOR DEVICE

(71) Applicants: FUJI ELECTRIC CO., LTD., Kawasaki (JP); MITSUBISHI ELECTRIC CORPORATION, Tokyo (JP)

(72) Inventors: Takeshi Tawara, Tsukuba (JP); Tomonori Mizushima, Matsumoto (JP); Shinichiro Matsunaga, Matsumoto (JP); Kensuke Takenaka, Tsukuba (JP); Manabu Takei, Shiojiri (JP); Hidekazu Tsuchida, Yokosuka (JP); Kouichi Murata, Yokosuka (JP); Akihiro Koyama, Tokyo (JP); Koji Nakayama, Tsukuba (JP); Mitsuru Sometani, Tsukuba (JP); Yoshiyuki Yonezawa, Tsukuba (JP); Yuji Kiuchi, Tsukuba (JP)

(73) Assignees: FUJI ELECTRIC CO., LTD., Kawasaki (JP); MITSUBISHI ELECTRIC CORPORATION, Tokyo (JP)

(*) Notice: Subject to any disclaimer, the term of this patent is extended or adjusted under 35 U.S.C. 154(b) by 588 days.

(21) Appl. No.: 17/538,331

(22) Filed: Nov. 30, 2021

(65) Prior Publication Data
US 2022/0123112 A1 Apr. 21, 2022

Related U.S. Application Data

(63) Continuation of application No. PCT/JP2020/020808, filed on May 26, 2020.

(30) Foreign Application Priority Data

Jul. 11, 2019 (JP) .................................. 2019-129407

(51) Int. Cl.
H01L 29/16 (2006.01)
H01L 29/06 (2006.01)
H01L 29/739 (2006.01)

(52) U.S. Cl.
CPC ...... H01L 29/1608 (2013.01); H01L 29/0696 (2013.01); H01L 29/7393 (2013.01)

(58) Field of Classification Search
CPC ............. H01L 29/0615; H01L 29/0619; H01L 29/0657; H01L 29/0696; H01L 29/0834;
(Continued)

(56) References Cited

U.S. PATENT DOCUMENTS

2008/0315299 A1 12/2008 Saito et al.
2009/0045413 A1* 2/2009 Ishii .................... H01L 29/8613
257/77
(Continued)

FOREIGN PATENT DOCUMENTS

CN 108807154 A 11/2018
JP 2007-165604 A 6/2007
(Continued)

OTHER PUBLICATIONS

International Search Report for PCT/JP2020/020808, issued on Aug. 4, 2020.
(Continued)

*Primary Examiner* — Fazli Erdem
(74) *Attorney, Agent, or Firm* — Rabin & Berdo, P.C.

(57) ABSTRACT

A silicon carbide semiconductor device has an active region and a termination structure portion disposed outside of the active region. The silicon carbide semiconductor device
(Continued)

includes a semiconductor substrate of a second conductivity type, a first semiconductor layer of the second conductivity type, a second semiconductor layer of a first conductivity type, first semiconductor regions of the second conductivity type, second semiconductor regions of the first conductivity type, a gate insulating film, a gate electrode, a first electrode, and a second electrode. During bipolar operation, a smaller density among an electron density and a hole density of an end of the second semiconductor layer in the termination structure portion is at most $1\times10^{15}/cm^3$.

20 Claims, 22 Drawing Sheets

(58) Field of Classification Search
CPC . H01L 29/0878; H01L 29/1608; H01L 29/32; H01L 29/7393; H01L 29/7395; H01L 29/745; H01L 29/7811; H01L 29/861; H01L 29/868
USPC .......................................................... 257/77
See application file for complete search history.

(56) References Cited

U.S. PATENT DOCUMENTS

| | | | |
|---|---|---|---|
| 2011/0165764 A1 | 7/2011 | Sasaki et al. | |
| 2012/0056201 A1* | 3/2012 | Wada | H01L 21/2007 |
| | | | 257/77 |
| 2015/0054025 A1 | 2/2015 | Lu | |
| 2018/0315842 A1 | 11/2018 | Tawara et al. | |
| 2019/0333987 A1* | 10/2019 | Miyata | H01L 29/0623 |
| 2022/0254919 A1* | 8/2022 | Matsunaga | H01L 29/1608 |
| 2023/0006045 A1* | 1/2023 | Kawabata | H01L 21/26513 |
| 2023/0133459 A1* | 5/2023 | Tanaka | H01L 29/45 |
| | | | 257/77 |

FOREIGN PATENT DOCUMENTS

| | | |
|---|---|---|
| JP | 2009-004547 A | 1/2009 |
| JP | 2012-004318 A | 1/2012 |
| JP | 2014-229794 A | 12/2014 |
| JP | 2018-125490 A | 8/2018 |
| JP | 2018-137483 A | 8/2018 |
| JP | 2018200920 A * | 12/2018 |
| WO | 2008088019 A1 | 7/2008 |
| WO | 2010/131573 A1 | 11/2010 |
| WO | 2014/030457 A1 | 2/2014 |

OTHER PUBLICATIONS

Written Opinion of the International Searching Authority for PCT/JP2020/020808, issued on Aug. 4, 2020.
Chinese Office Action dated Jun. 27, 2024, in the counterpart Chinese Patent Application 202080039260.3.

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This is a continuation application of International Application PCT/JP2020/020808 filed on May 26, 2020 which claims priority from a Japanese Patent Application No. 2019-129407 filed on Jul. 11, 2019, the contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Single-crystal silicon (Si) is conventionally used as a material in a power semiconductor device for controlling high voltages and large currents. At present, there are several types of silicon power semiconductor devices, each used according to an intended application. For example, PiN diodes (p-intrinsic-n diodes), bipolar transistors, and IGBTs (insulated gate bipolar transistors) are so-called bipolar devices. While these device elements achieve high current density, high-speed switching is impossible and usage limits for bipolar transistors is a few kHz and about 20 kHz for IGBTs. On the other hand, while power MOSFETs (metal oxide semiconductor field effect transistors: insulated gate field effect transistors) cannot handle large currents, they can be used at high speeds up to a few MHz. Nonetheless, there is a strong demand in the market for large-current, high-speed power devices and efforts have been poured into the improvement of silicon IGBTs and power MOSFETs; at present, development has nearly reached the theoretical limit determined by silicon.

Further, materials have been investigated from the perspective of power semiconductor devices and recently, in particular, since device elements have low ON voltage and excellent high-speed/high-temperature characteristics, silicon carbide (SiC) has been gathering attention for next generation power semiconductor devices. This is because SiC is a very stable material chemically, has a wide bandgap of 3 eV, and can be used very stably as a semiconductor even under high temperatures. Further, SiC has a critical electric field strength that is at least ten times that of silicon. SiC has a high possibility of exceeding the material limit of silicon and therefore, future growth in power semiconductor applications is greatly expected. In particular, under ultra-high breakdown voltage applications such as pulsed power and electrical power exceeding a breakdown voltage of 10 kV, there are growing expectations for PiN diodes that are bipolar devices.

FIG. 20 is a cross-sectional view depicting a structure of a conventional bipolar semiconductor device having an n-type semiconductor substrate. FIG. 20 depicts a PiN diode 161. The PiN diode 161 depicted in FIG. 20 is configured using a silicon carbide wafer in which an n-type buffer layer 102, an n-type drift layer 103, and a p-type anode layer 104 are sequentially stacked on a front surface of an n-type silicon carbide substrate 101 by epitaxial growth. An anode electrode 105 is provided on the p-type anode layer 104, and a cathode electrode 106 is provided on a back surface.

The p-type anode layer 104 is provided only in an active region 151 through which current flows in an ON state and is not provided in an edge termination region 152. The edge termination region 152 surrounds a periphery of the active region 151 and has a function of mitigating electric field concentration at ends of the active region 151 and sustaining a predetermined breakdown voltage (withstand voltage). The breakdown voltage is a voltage limit at which no erroneous operation or destruction of a device element occurs. In the edge termination region 152, for example, a voltage withstanding structure is disposed constituted by p-type termination regions 107 that have differing impurity concentrations and that are disposed in ascending order of impurity concentration from an outer side (side surface of the semiconductor substrate).

As described above, normally, a bipolar power semiconductor device using a silicon carbide semiconductor has a structure in which at least two n-type or p-type semiconductor layers are stacked on an n-type silicon carbide substrate. This is because increasing the quality and reducing the resistance of a p-type silicon carbide substrate is difficult and an n-type silicon carbide substrate can be fabricated (manufactured) more easily. Further, patterns for a termination structure, a mesa structure, a MOS structure or an electrode structure of a PiN diode, a p-channel IGBT, an n-GTO (gate turn-off thyristor), etc. are formed on a side (this is assumed as a front surface) opposite to a substrate side because semiconductor layers of the substrate side are thick, and patterning of the substrate is difficult.

FIG. 21 is a graph depicting distribution of carriers in the drift layer of the conventional bipolar semiconductor device having the n-type semiconductor substrate. In FIG. 21, a horizontal axis indicates depth from a surface of the p-type anode layer 104 in units of μm. A vertical axis indicates a density of electrons or holes in units of $cm^{-3}$. In FIG. 21, a thin line indicates the density of electrons, and a thick line indicates the density of holes. At depths from 0 μm to 100 μm, the density of the electrons and the density of the holes are substantially equal to each other and therefore, only a thick line is drawn. Here, the density of the electrons is a density of free electrons in the semiconductor layers.

As depicted in FIG. 21, in a bipolar silicon carbide semiconductor device element such as a PiN diode using the n-type semiconductor substrate, at the p-type anode layer 104 of the surface of the drift layer constituted by the n-type buffer layer 102, the n-type drift layer 103, and the p-type anode layer 104, the density of holes is high and hole current flows predominately in a direction of arrow B in later-described FIG. 22; and in the n-type buffer layer 102, the density of electrons is high and electron current flows predominantly in a direction of arrow A in later-described FIG. 22.

FIG. 22 is a cross-sectional view depicting distribution of carriers in the drift layer of the conventional bipolar semiconductor device having the n-type semiconductor substrate. The density of holes (hDensity) is depicted as the distribution of carriers. Mobility of the holes of the silicon carbide is ⅒ of the mobility of the electrons and therefore, the densities of the carriers (electrons and holes) in the drift layer are greater at the p-type anode layer 104 of the surface than closer to the n-type buffer layer 102 of the substrate side. As a result of this, conductivity modulation occurs below the p-type anode layer 104 of the surface, and current concentrates below the p-type anode layer 104 of the active region 151.

Further, suppression of an occurrence of stacking faults and area expansion thereof as well as suppression of forward voltage increases by forming, at a mesa wall portion or the mesa wall portion and mesa peripheral portion, a bipolar-degradation preventing layer that spatially separates a pn junction interface and a surface of the mess wall portion or the mesa wall portion and mesa peripheral portion is known (refer to Japanese Laid-Open Patent Publication No. 2007-165604). Further, prevention of forward voltage increases by a buffer layer formed between an n-type SiC substrate and an n-type drift layer operating as a trap for holes from a p-type anode layer and preventing minority carriers from reaching the substrate is known (refer to, Japanese Laid-Open Patent Publication No. 2012-4318).

SUMMARY OF THE INVENTION

According to an embodiment of the invention, a silicon carbide semiconductor device having an active region through which a current passes, and a termination structure portion disposed outside of the active region and in which a voltage withstanding structure surrounding a periphery of the active region is formed, includes: a semiconductor substrate of a second conductivity type, having a main surface side; a first semiconductor layer of the second conductivity type, provided on the main surface side of the semiconductor substrate; a second semiconductor layer of a first conductivity type, provided on a surface of the first semiconductor layer, at a side thereof opposite to that facing the semiconductor substrate; a plurality of first semiconductor regions of the second conductivity type, provided in a surface layer of the second semiconductor layer, at a side thereof opposite to that facing the semiconductor substrate; a plurality of second semiconductor regions of the first conductivity type, provided in surface layers of the first semiconductor regions, at sides thereof opposite to those facing the semiconductor substrate, the second semiconductor regions having an impurity concentration higher than that of the second semiconductor layer; a gate insulating film provided on surfaces of regions of the first semiconductor regions, between the second semiconductor layer and the second semiconductor regions; a gate electrode provided on the gate insulating film; a first electrode in contact with the first semiconductor regions and the second semiconductor regions; and a second electrode provided at another main surface side of the semiconductor substrate. During bipolar operation of the silicon carbide semiconductor device, a smaller density as between an electron density and a hole density of the second semiconductor layer in the termination structure portion at an end thereof is at most $1\times10^{15}/cm^3$, the end of the termination structure portion being located at a side opposite to a side where the active region is provided.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques are discussed. Here, in a channel region, mobility of electrons is greater than mobility of holes, and fabrication of a low-resistance IGBT can be expected. Therefore, development of an n-channel IGBT having a p-type semiconductor substrate is advancing.

Figure 23:
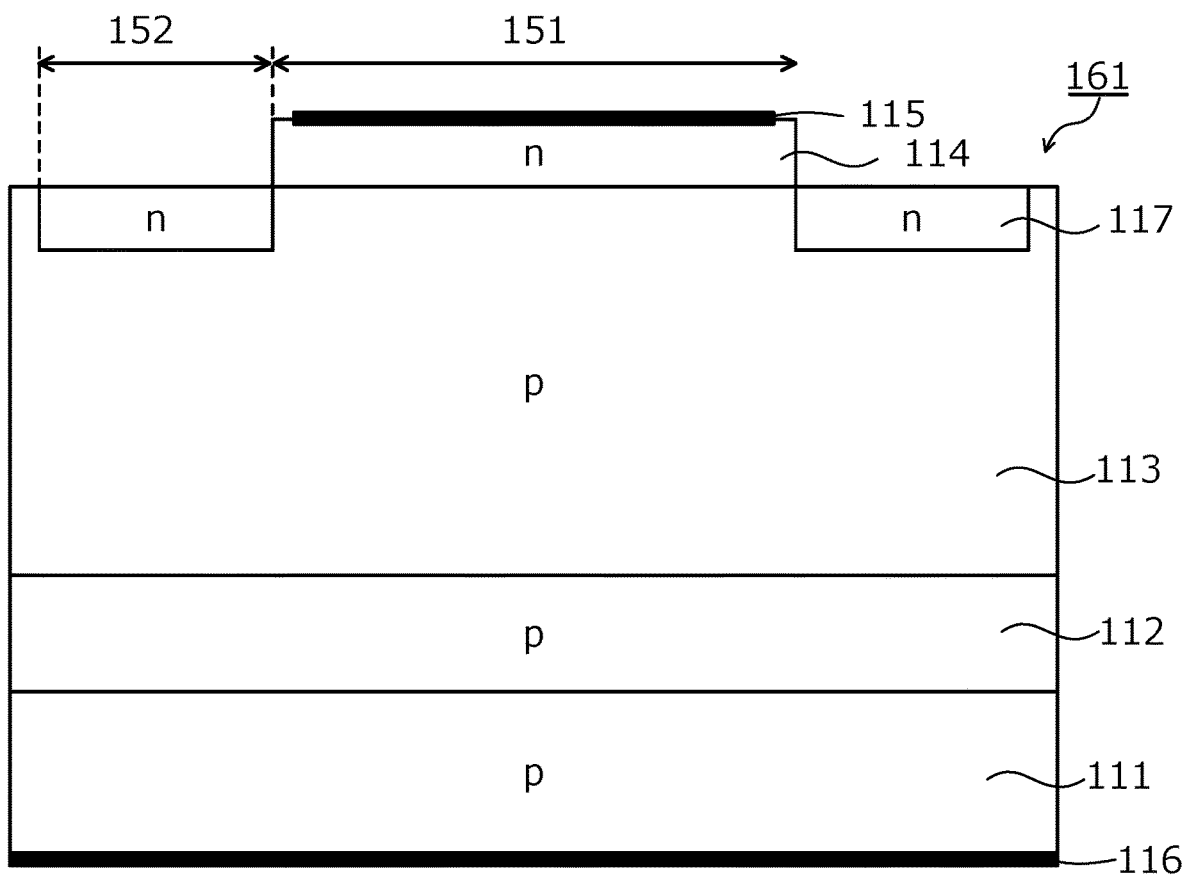
FIG. 23 is a cross-sectional view depicting a structure of a conventional bipolar semiconductor device having a p-type semiconductor substrate.

FIG. 23 is a cross-sectional view depicting a structure of a conventional bipolar semiconductor device having a p-type semiconductor substrate. FIG. 23 depicts the PiN diode 161. The PiN diode 161 depicted in FIG. 23 is configured using a silicon carbide wafer in which a p-type buffer layer 112, a p-type drift layer 113, and an n-type cathode layer 114 are sequentially stacked, by epitaxial growth, on a front surface of a p-type silicon carbide substrate 111. The n-type cathode layer 114 is provided only in the active region 151 through which current flows in an ON state and is not provided in the edge termination region 152.

Figure 24:
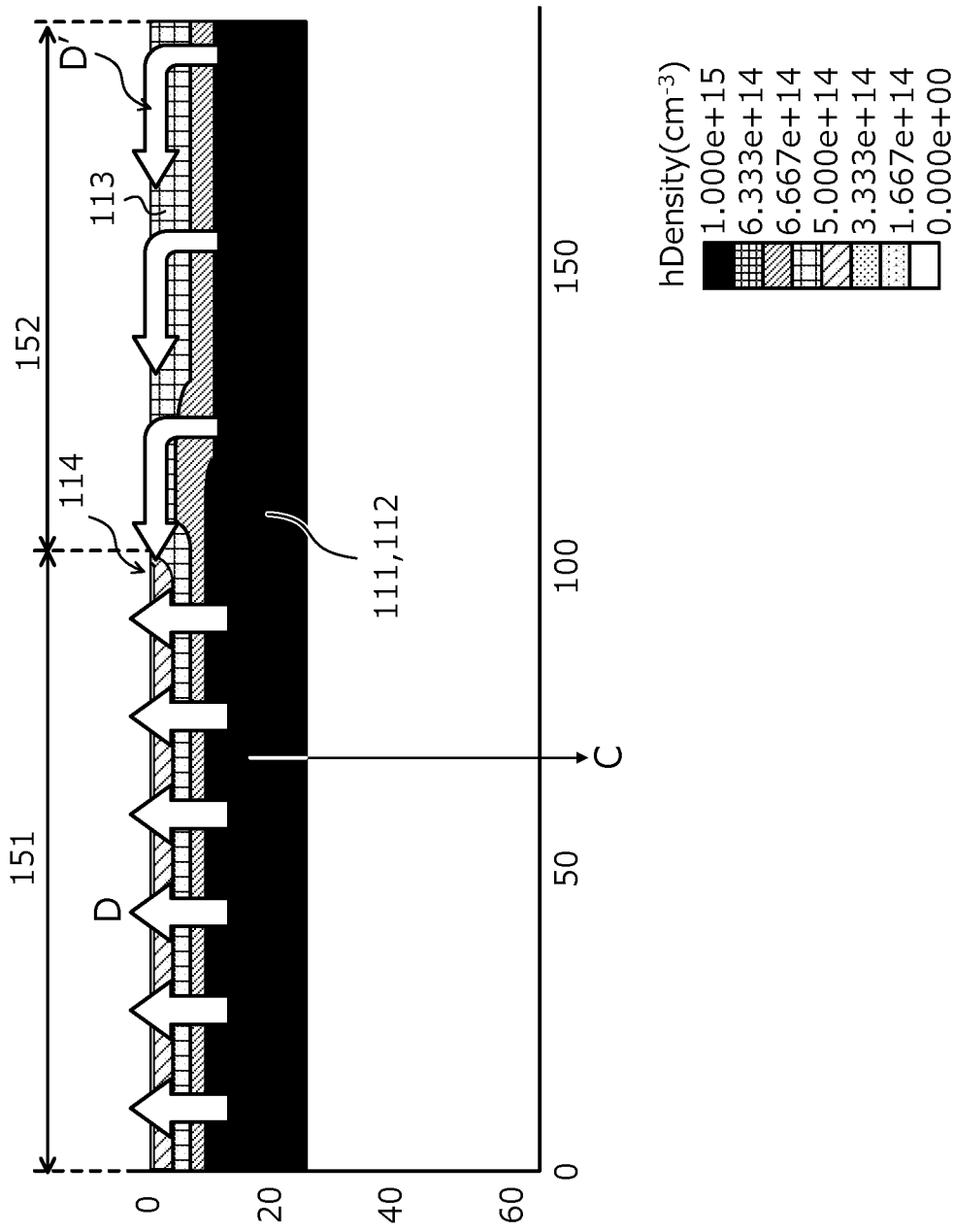
FIG. 24 is a cross-sectional view showing carrier distribution in a drift layer of the conventional bipolar semiconductor device having a p-type semiconductor substrate.

FIG. 24 is a cross-sectional view showing carrier distribution in the drift layer of the conventional bipolar semiconductor device having a p-type semiconductor substrate. Hole density (hDensity) is shown as the carrier distribution. In the drift layer of a bipolar silicon carbide semiconductor device element such as a PiN diode that uses a p-type semiconductor substrate, near the p-type buffer layer 112 on the substrate side, electron current predominately flows in a direction indicated by arrow C in FIG. 24; and in the n-type cathode layer 114 at the surface, hole current predominately flows in a direction indicated by arrow D in FIG. 24.

Hole mobility of silicon carbide is $\frac{1}{10}$ of electron mobility and therefore, carrier (electron and hole) density in the drift layer is greater near the p-type buffer layer 112 on the substrate side than near the n-type cathode layer 114 on the surface side. As a result, from the n-type cathode layer 114 on the surface side, conductivity modulation occurs between ends of the edge termination region 152 of device element, and a portion of current (arrow D' in FIG. 24) flows from the edge termination region 152 to the active region 151.

In the bipolar semiconductor device element that uses a silicon carbide semiconductor, a forward voltage increase phenomenon occurs in which the ON voltage increases with bipolar operation in the ON state. This occurs because, due to recombination energy of the electrons and the holes, linear defects called basal plane dislocations (BPDs) in the silicon carbide semiconductor expand into plane defects called stacking faults, thereby forming a high-resistance layer.

Due to recent advancements in crystal growth technologies, conductivity modulation occurs, and basal plane dislocations in the drift layer in which recombination of electrons and holes occurs have substantially disappeared. Nonetheless, in the substrate, at the device element surface, and at device element ends, basal plane dislocations may be introduced due to processing, etc. In this case, a problem arises in that in the bipolar silicon carbide semiconductor device element that uses a p-type semiconductor substrate, carriers are also present between a device element active region of the surface and device element ends and at the device element ends as well, carrier recombination occurs, the forward voltage increase phenomenon occurs, and reliability of the semiconductor device element decreases.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
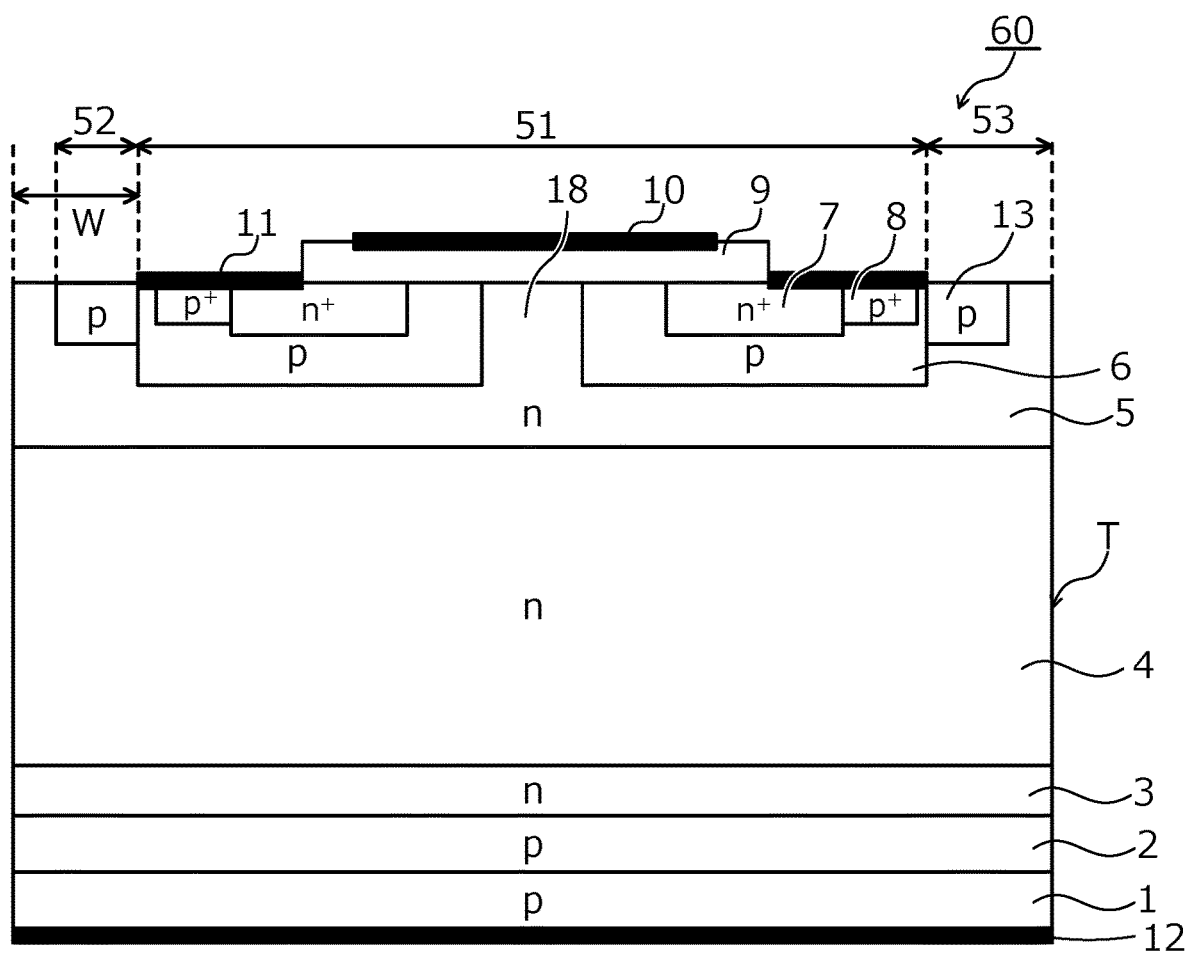
FIG. 1 is a cross-sectional view depicting a structure of a silicon carbide semiconductor device according to a first embodiment.

An n-channel silicon carbide IGBT 60 is described as an example of a silicon carbide semiconductor device according to the present invention. FIG. 1 is a cross-sectional view depicting a structure of a silicon carbide semiconductor device according to a first embodiment.

As depicted in FIG. 1, the n-channel silicon carbide IGBT 60 is configured using a silicon carbide wafer in which a p-type collector layer (first semiconductor layer of a second conductivity type) 2, an n-type field stop layer (third semiconductor layer of a first conductivity type) 3, an n-type drift layer (second semiconductor layer of the first conductivity type) 4, and an n-type carrier accumulating layer 5 are sequentially stacked on a front surface of a p-type silicon carbide substrate (semiconductor substrate of the second conductivity type) 1. The n-type field stop layer 3 and the n-type carrier accumulating layer 5 can be omitted. At a surface of the n-type carrier accumulating layer 5 (in an instance in which the n-type carrier accumulating layer 5 omitted, the n-type drift layer 4, hereinafter, simply "(4)"), p-type base regions (first semiconductor regions of the second conductivity type) 6 is selectively provided.

The p-type silicon carbide substrate 1 is a silicon carbide single crystal substrate doped with, for example, aluminum (Al). The p-type collector layer 2 is a layer provided having an impurity concentration lower than that of the p-type silicon carbide substrate 1. The n-type field stop layer 3 is a layer provided having an impurity concentration higher than that of the n-type drift layer 4. During an OFF state, a depletion layer that spreads in the n-type field stop layer 3, from the n-type drift layer 4 that has a high resistance is suppressed by the n-type field stop layer 3 and therefore, even when the n-type drift layer 4 is thin, punch-through in which the depletion layer reaches the p-type collector layer 2 can be prevented. The n-type field stop layer 3 may be a single layer or may be multiple layers and in an instance of multiple layers, the multiple layers may have a same set film thickness and set carrier concentration or may be stacked having differing set film thicknesses and set carrier concentrations.

Here, the IGBT has an advantage in that the ON resistance is low due to a conductivity modulation effect. Conventionally, to efficiently reduce the ON resistance by the conductivity modulation effect, as described above, in the n-type drift layer 4, at a base front side thereof, the n-type carrier accumulating layer 5 of a same conductivity type as the n-type drift layer 4 and having an impurity concentration higher than that of the n-type drift layer 4 is provided. The n-type carrier accumulating layer 5 is a minority carrier barrier and an accumulation effect of minority carriers is high, whereby current density between a collector and an emitter is increased and the conductivity modulation effect increases.

In the silicon carbide wafer, at a front side thereof (side having the later-described p-type base regions 6), a MOS gate (insulated gate formed by a metal, an oxide film, and a semiconductor) structure (device element structure) is provided. A MOS gate is formed by the p-type base regions 6, $n^+$-type emitter regions (second semiconductor regions of the first conductivity type) 7, $p^+$-type contact regions 8, a gate insulating film 9, and a gate electrode 10. In particular, the p-type base regions 6 are provided above the n-type carrier accumulating layer 5 (4) and are formed by ion implantation. In the p-type base regions 6, an n-type JFET region (junction field effect transistor) 18 penetrating through the p-type base regions 6 in a depth direction and reaching the n-type carrier accumulating layer 5 (4) is provided. The JFET region 18 has an impurity concentration high than the impurity concentration of the n-type drift layer 4. The JFET region 18 has a function of reducing JFET resistance and reducing the ON resistance. In a portion of the p-type base regions 6 other than the JFET region 18, a channel is formed along the gate insulating film 9.

Further, in the p-type base regions 6, the $n^+$-type emitter regions 7 are selectively provided. In the p-type base regions 6, the $p^+$-type contact regions 8 may be selectively provided. In this instance, the $n^+$-type emitter regions 7 may be provided deeper than is the p-type base regions 6. The $n^+$-type emitter regions 7 and the $p^+$-type contact regions 8 are provided separate from the JFET region 18. The $p^+$-type contact regions 8 are disposed in contact with the $n^+$-type emitter regions 7, at positions farther from the JFET region 18 than are the $n^+$-type emitter regions 7. On a surface of the p-type base regions 6, at portions thereof between the JFET region 18 and the $n^+$-type emitter regions 7, the gate insulating film 9 extending on the surfaces of the $n^+$-type emitter regions 7, from the JFET region 18 is provided. On the surface of the gate insulating film 9, the gate electrode 10 is provided. An interlayer insulating film (not depicted) is provided so as to cover the gate electrode 10.

The interlayer insulating film is provided on a front surface of the silicon carbide wafer. In contact holes penetrating through the interlayer insulating film in the depth direction, the $n^+$-type emitter regions 7 and the $p^+$-type contact regions 8 are exposed. Emitter electrodes 11 are in contact with the $n^+$-type emitter regions 7 and the $p^+$-type contact regions 8 via the contact holes penetrating through the interlayer insulating film in the depth direction and are electrically insulated from the gate electrode 10 by the gate insulating film 9 and the interlayer insulating film. In an instance in which the $p^+$-type contact regions 8 are omitted, the emitter electrodes 11 are in contact with the $n^+$-type emitter regions 7 and the p-type base regions 6. A collector electrode 12 is provided on a back surface (i.e., back surface of the p-type silicon carbide substrate 1) of the silicon carbide wafer.

In such a silicon carbide IGBT, when positive voltage is applied to the gate electrode 10, an inversion layer is formed near a vicinity of the p-type base regions 6 (p-type silicon carbide channel layer) in contact with the gate insulating film 9 and the IGBT turns ON. When electrons flowing out from the channel reach the n-type drift layer 4 from the n-type carrier accumulating layer 5 intervening the p-type base regions 6, a PNP transistor formed by the p-type base regions 6, the n-type drift layer 4, and the p-type collector layer 2 turns ON, holes (holes) from the p-type collector layer 2 are injected into the n-type drift layer 4, thereby reducing the resistance by conduction modulation.

On the other hand, during the off-state of IGBT, a depletion layer spreads from the p-type base regions 6, through the n-type carrier accumulating layer 5, to the n-type drift layer 4. At this time, when electric field concentrates at corner portions or side portions of the p-type base regions 6, avalanche breakdown occurs.

Figure 2:
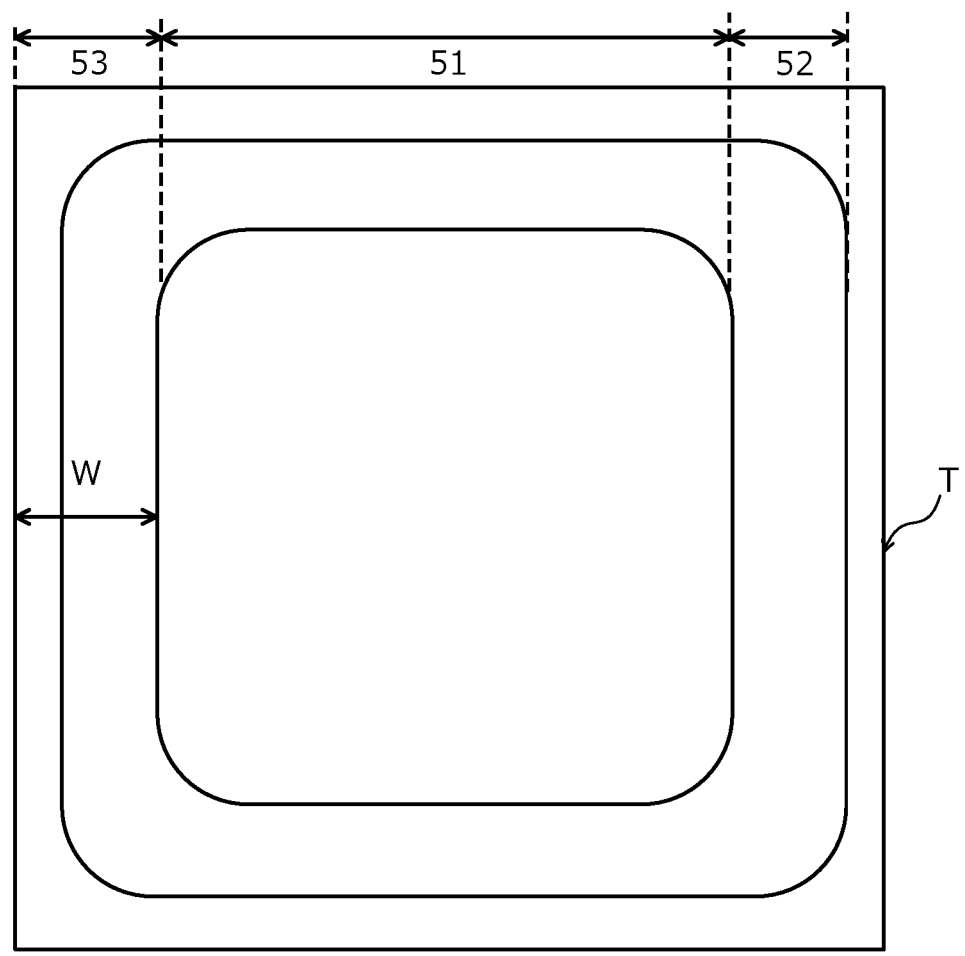
FIG. 2 is a top view depicting the structure of the silicon carbide semiconductor device according to the first embodiment.

FIG. 2 is a top view depicting the structure of the silicon carbide semiconductor device according to the first embodiment. As depicted in FIG. 2, an edge termination region 52 is disposed so as to surround an active region 51. Further, as depicted in FIG. 1, the p-type base regions 6 and the JFET region 18 are provided only in the active region 51 through which current flows in an ON state and are not provided in the edge termination region 52. A termination structure portion 53 is a region surrounding the active region 51, from the active region 51 to ends T of the p-type silicon carbide substrate (semiconductor chip) 1.

Figure 3:
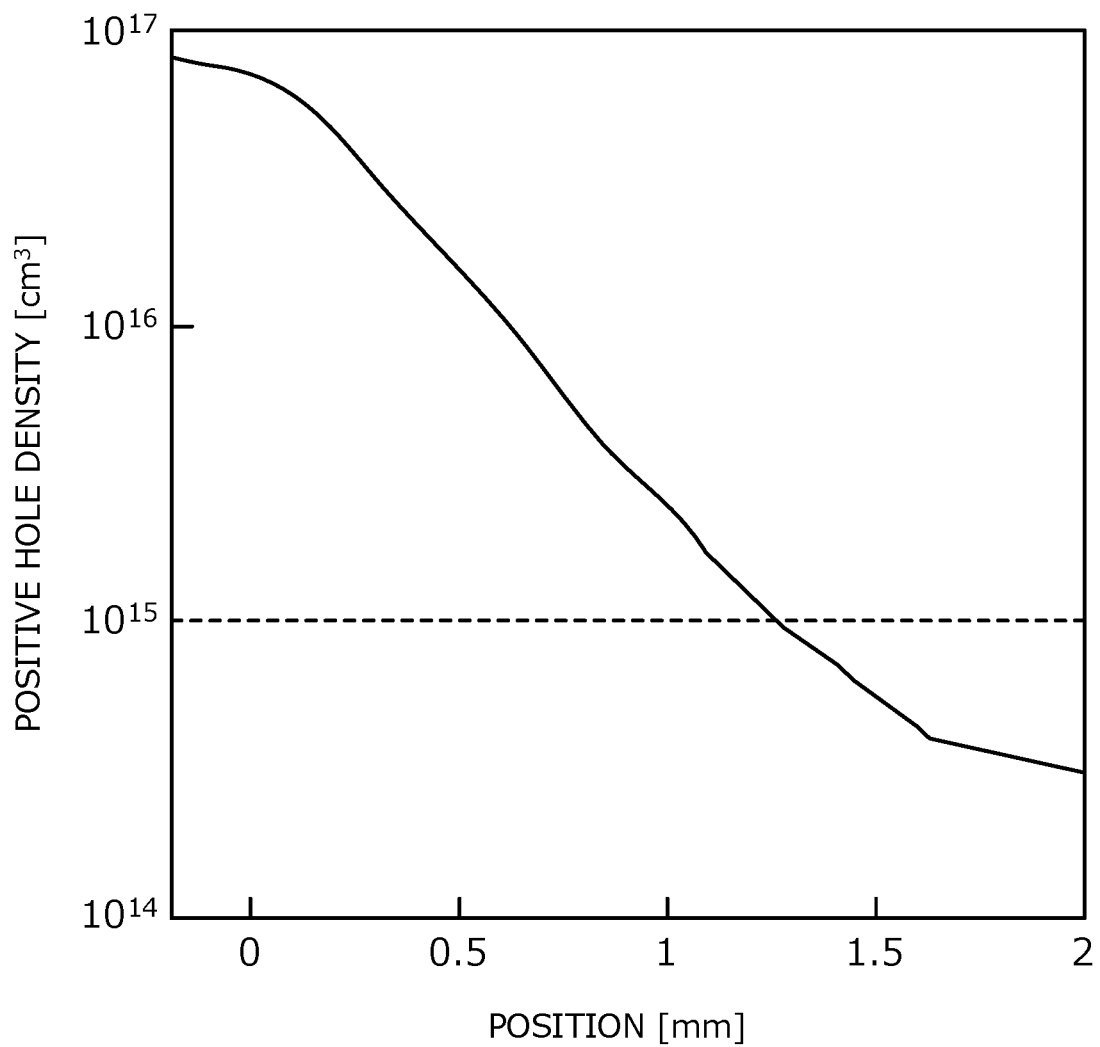
FIG. 3 is a graph depicting dependence of carrier density on distance from an active region.

FIG. 3 is a graph depicting dependence of carrier density on the distance from the active region. In FIG. 3, a horizontal axis indicates position from the active region 51 in units of mm. A vertical axis indicates hole density as carrier density in units of $cm^{-3}$. Further, FIG. 3 shows simulation results for room temperature (about 25 degrees C.) and a current of 100 $A/cm^2$ when carrier lifetime of holes is assumed to be 10 μs.

Here, when the carrier density exceeds a threshold $1\times10^{15}/cm^3$, a stacking fault (SF) expands from an end T of the n-type drift layer 4. As depicted in FIG. 3, for a region at a position not more than 1.2 mm from an end T of the chip, the carrier density during bipolar operation is at least $1\times10^{15}/cm^3$. An instance when the carrier density is the electron density has a similar results. Therefore, in the silicon carbide semiconductor device of the first embodiment, by setting a distance from the active region 51 to the ends T of the chip to be at least 1.2 mm, the smaller of the electron density and the hole density at the ends T of the chip during bipolar operation is set to be at most the threshold $1\times10^{15}/cm^3$ at which a stacking fault (SF) expands. Therefore, during bipolar operation of the semiconductor chip, expansion of a stacking fault (SF) from an end T of the chip can be suppressed. Further, to cope with high temperature and large current, the distance from the active region 51 to the ends T of the chip is preferably at least 1.5 mm and more preferably at least 2.0 mm.

The silicon carbide substrate has a 4-degree off-angle for epitaxially growing a semiconductor layer on the substrate. An orientation (off-direction) in which the off-angle is provided is a <11-20> orientation. Here, an expanding direction of a stacking fault is a direction <1-100> orthogonal to the off-direction and therefore, at least in the direction <1-100>, the distance from the active region 51 to the ends T of the chip has to be at least 1.2 mm.

Figure 4:
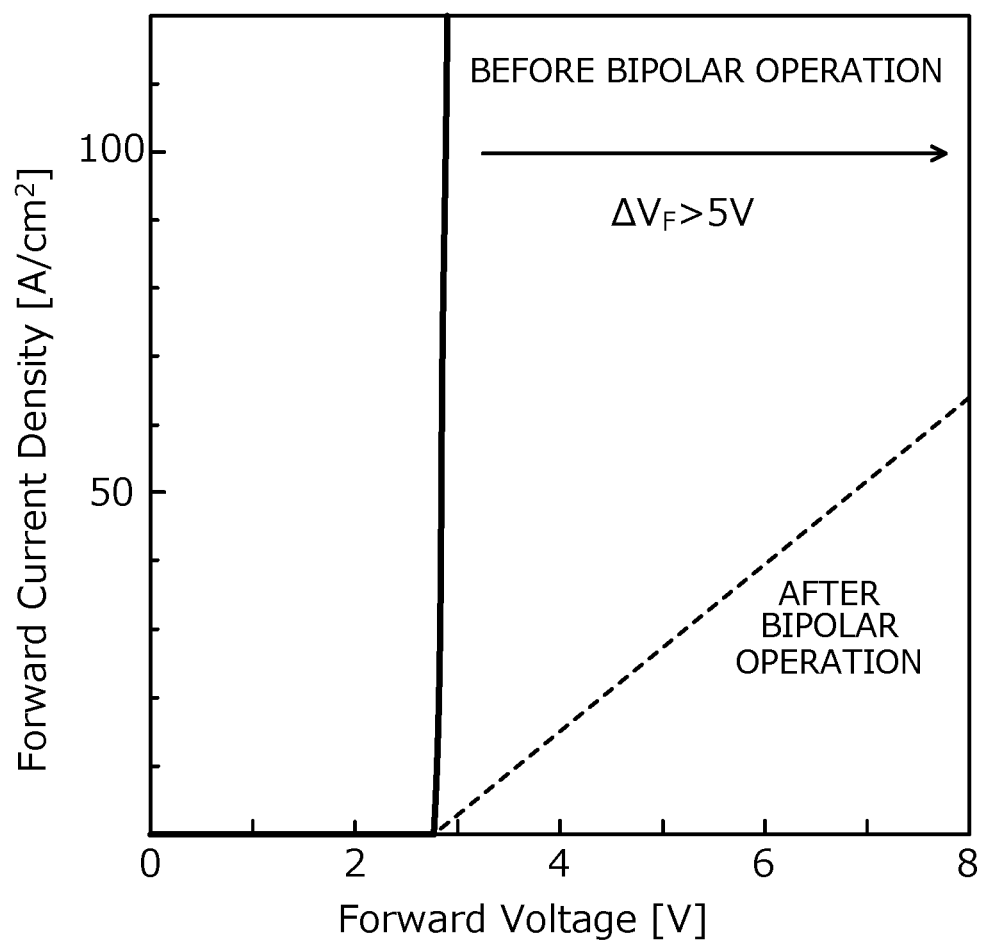
FIG. 4 is a graph showing characteristics of a conventional silicon carbide semiconductor device before and after bipolar operation.
Figure 5:
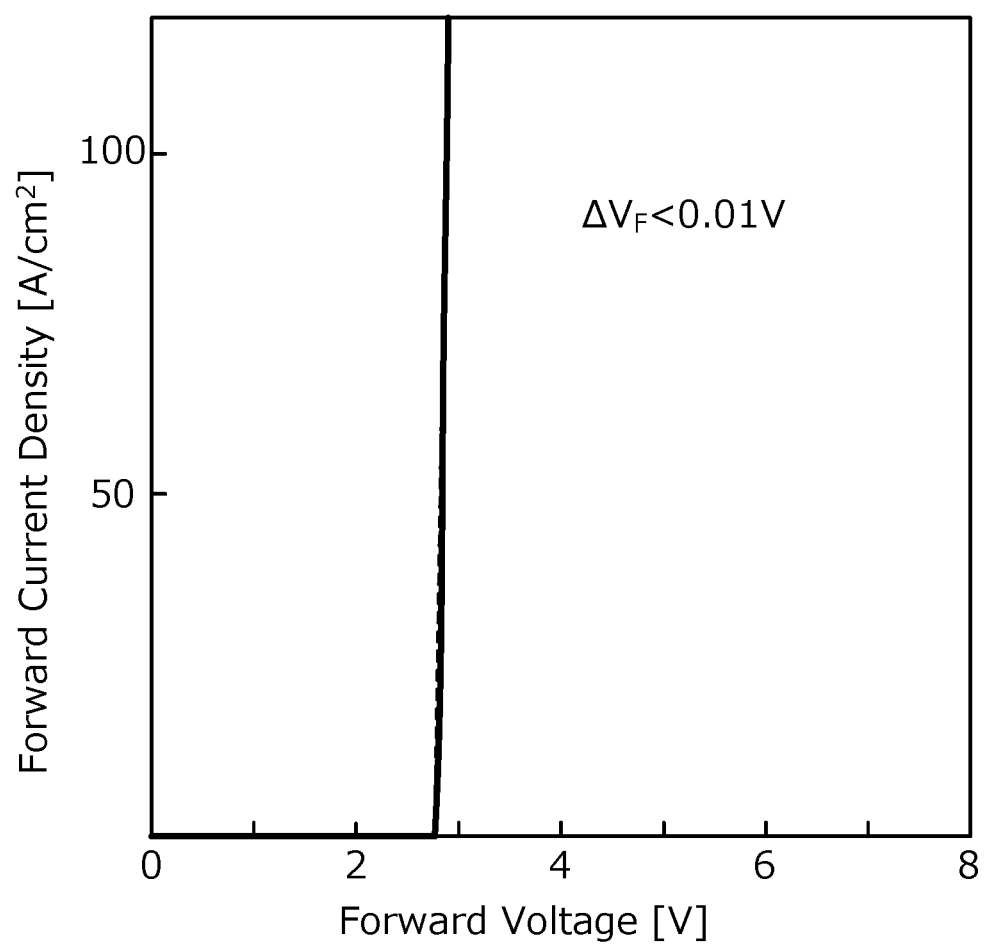
FIG. 5 is a graph showing characteristics of the silicon carbide semiconductor device according to the first embodiment before and after bipolar operation.

FIG. 4 is a graph showing characteristics of a conventional silicon carbide semiconductor device before and after bipolar operation. FIG. 5 is a graph showing characteristics of the silicon carbide semiconductor device according to the first embodiment before and after bipolar operation. In FIG. 4 and FIG. 5, the characteristics before bipolar operation are indicated by solid lines while the characteristics after bipolar operation are indicated by a dotted line. In FIG. 4 and FIG. 5, a horizontal axis indicates forward voltage in units of V while a vertical axis indicates forward current density in units of $A/cm^2$. Here, in the conventional silicon carbide semiconductor device, the distance from the active region 151 to the ends T of the chip is 0.5 mm, while in the silicon carbide semiconductor device according to the first embodiment, the distance from the active region 51 to the ends T of the chip (distance from the active region 51 to an end of the termination structure portion 53) is at least 1.2 mm.

As depicted in FIG. 4, in the conventional silicon carbide semiconductor device, at a device element end, recombination of carriers occurs, whereby the forward voltage increase phenomenon occurs. In FIG. 4, before bipolar operation and after bipolar operation, an increase ΔVf of the forward voltage by a forward current density of 100 A/cm$^2$ is at least 5V and the forward voltage increases significantly. On the other hand, in the silicon carbide semiconductor device according to the first embodiment, at a device element end, the density of the carriers is at most $1\times10^{15}$/cm$^3$ and therefore, the recombination of carriers does not occur. Thus, the increase ΔVf of the forward voltage by the forward current density of 100 A/cm$^2$ is at most 0.01V and forward voltage increases are suppressed with nearly no change in the forward voltage.

Figure 6:
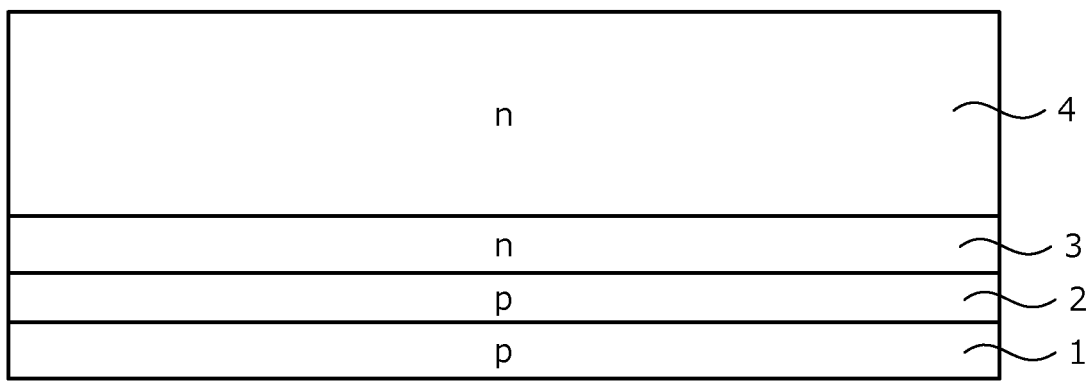
FIG. 6 is a cross-sectional view depicting a state of the silicon carbide semiconductor device according to the first embodiment during manufacture.
Figure 7:
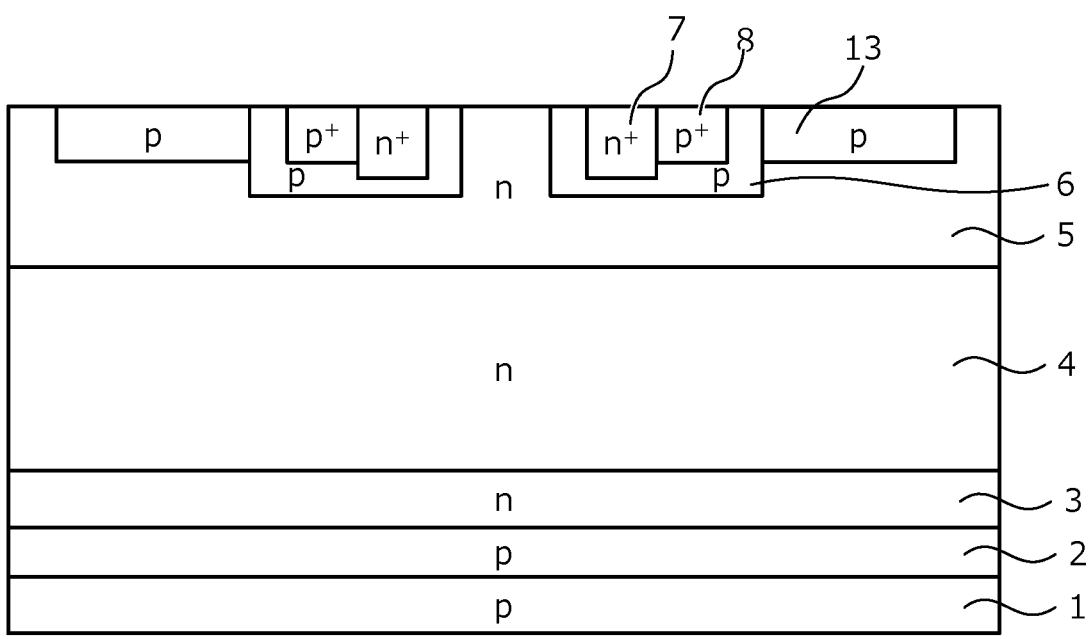
FIG. 7 is a cross-sectional view depicting a state of the silicon carbide semiconductor device according to the first embodiment during manufacture.
Figure 8:
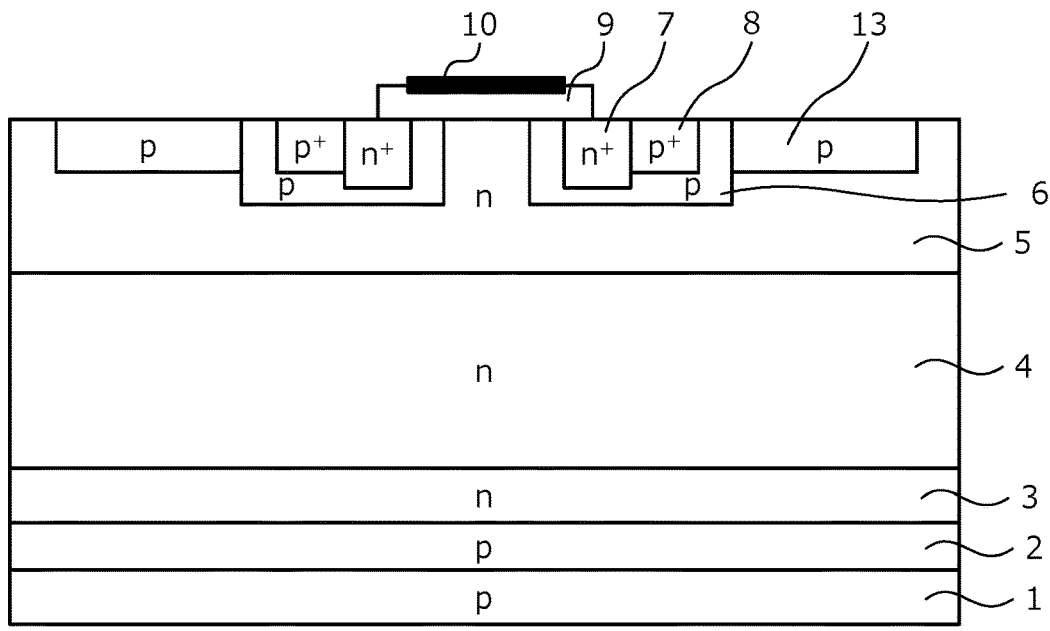
FIG. 8 is a cross-sectional view depicting a state of the silicon carbide semiconductor device according to the first embodiment during manufacture.

A method of manufacturing the silicon carbide semiconductor device according to the first embodiment is described taking an instance of manufacture of an n-channel type IGBT, using silicon carbide as a semiconductor material. FIGS. 6, 7, and 8 are cross-sectional views depicting states of the silicon carbide semiconductor device according to the first embodiment during manufacture.

First, the p-type silicon carbide substrate 1 containing a p-type silicon carbide is prepared. Next, on a first main surface (front surface) of the p-type silicon carbide substrate 1, the p-type collector layer 2, the n-type field stop layer 3, and the n-type drift layer 4 are deposited by epitaxial growth. The state up to here is depicted in FIG. 6.

Next, the n-type carrier accumulating layer 5 is deposited on the surface of the n-type drift layer 4 by epitaxial growth. Next, an ion implantation mask opened at portions corresponding to formation regions of the p-type base regions 6 is formed on the surface of the n-type carrier accumulating layer 5. Next, the p-type base regions 6 are formed by ion implantation of a p-type impurity using the ion implantation mask. A region of the n-type carrier accumulating layer 5 sandwiched between the p-type base regions 6 is the JFET region 18. Next, the ion implantation mask is removed.

Next, by photolithography and ion implantation of a p-type impurity, the p$^+$-type contact regions 8 are selectively formed in the p-type base regions 6, at surfaces thereof. Next, by photolithography and ion implantation of an n-type impurity, the n$^+$-type emitter regions 7 are selectively formed in the p-type base regions 6, at surfaces thereof. Next, by photolithography and ion implantation of a p-type impurity, p-type termination regions 13 are selectively formed in the n-type carrier accumulating layer 5, at the surface thereof in the edge termination region 52.

A sequence in which the ion implantation for forming the n$^+$-type emitter regions 7 and the p$^+$-type contact regions 8 described above can be variously changed. Next, activation annealing (heat treatment) for activating diffused regions formed by the ion implantations is performed. The state up to here is depicted in FIG. 7.

Next, the front surface of the silicon carbide wafer (surface having the p-type base regions 6) is thermally oxidized, forming the gate insulating film 9. Next, on the gate insulating film 9, for example, a polycrystalline silicon (poly-Si) layer is formed and patterned as the gate electrode 10.

Next, the interlayer insulating film (not depicted) is formed so as to cover the gate electrode 10 and a heat treatment (reflow) is performed after patterning. During patterning of the interlayer insulating film, contact holes are formed and portions of the gate insulating film 9 exposed in the contact holes are also removed, exposing the n$^+$-type emitter regions 7 and the p$^+$-type contact regions 8. The state up to here is depicted in FIG. 8.

Next, for example, by a sputtering method, the emitter electrodes 11 are formed so as to be embedded in the contact holes. Next, the collector electrode 12 is formed on the back surface of the p-type silicon carbide substrate 1. Next, on the emitter electrodes 11, emitter wiring (not depicted) is formed. Next, a protective film (not depicted) is formed on the front surface of the silicon carbide wafer. Thereafter, the silicon carbide wafer is cut (diced) into individual chips, whereby the IGBT depicted in FIG. 1 is completed.

As described above, according to the first embodiment, carrier density at the ends of the chip is at most the threshold $1\times10^{15}$/cm$^3$ at which a stacking fault (SF) expands and as a result, during bipolar operation of the semiconductor chip, expansion of a stacking fault (SF) from an end of the chip can be suppressed. Therefore, forward voltage increases can be suppressed.

Figure 9:
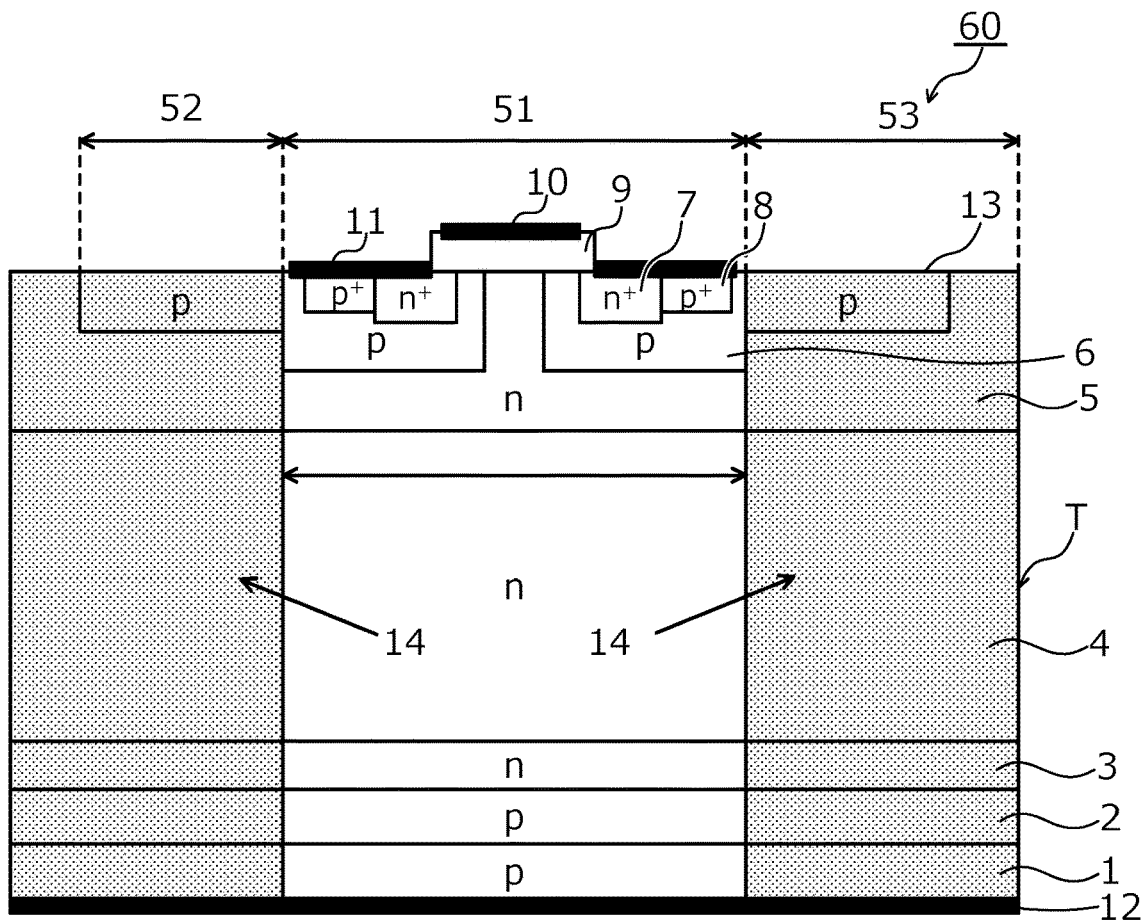
FIG. 9 is a cross-sectional view depicting a structure of a silicon carbide semiconductor device according to a second embodiment.

FIG. 9 is a cross-sectional view depicting a structure of a silicon carbide semiconductor device according to a second embodiment. In the second embodiment, in an entire region from the active region 51 to the ends T (from the active region 51 to the ends of the termination structure portion 53), a low-lifetime region 14 is provided in a height (thickness) direction of the p-type silicon carbide substrate (semiconductor chip) 1. In the low-lifetime region 14, damage is inducted in the crystal structure by electron beam irradiation. By providing the low-lifetime region 14, the lifetime of carriers at the ends T of the chip can be shortened, injection of carriers (holes) into the end portions of the chip can be suppressed, and expansion of a stacking fault (SF) from an end of the chip can be suppressed. Further, the expanding direction of a stacking fault is the direction <1-100> orthogonal to the off-direction and therefore, at least in the direction <1-100>, the low-lifetime region 14 has to be provided in the region from the active region 51 to the ends T of the chip.

Further, in the silicon carbide semiconductor device according to the second embodiment, for example, after the device element structure is formed but before the p-type silicon carbide substrate 1 is diced, the low-lifetime region 14 can be formed by irradiating an electron beam in the region of the p-type silicon carbide substrate 1, from the active region 51 to the ends T.

As described above, according to the second embodiment, the low-lifetime region is provided from the active region to the ends. As a result, the lifetime of the carriers at the ends of the chip can be shortened, injection of carriers (holes) into the end portions of the chip can be suppressed, and expansion of a stacking fault (SF) from an end of the chip can be suppressed. Therefore, forward voltage increases can be suppressed.

Figure 10:
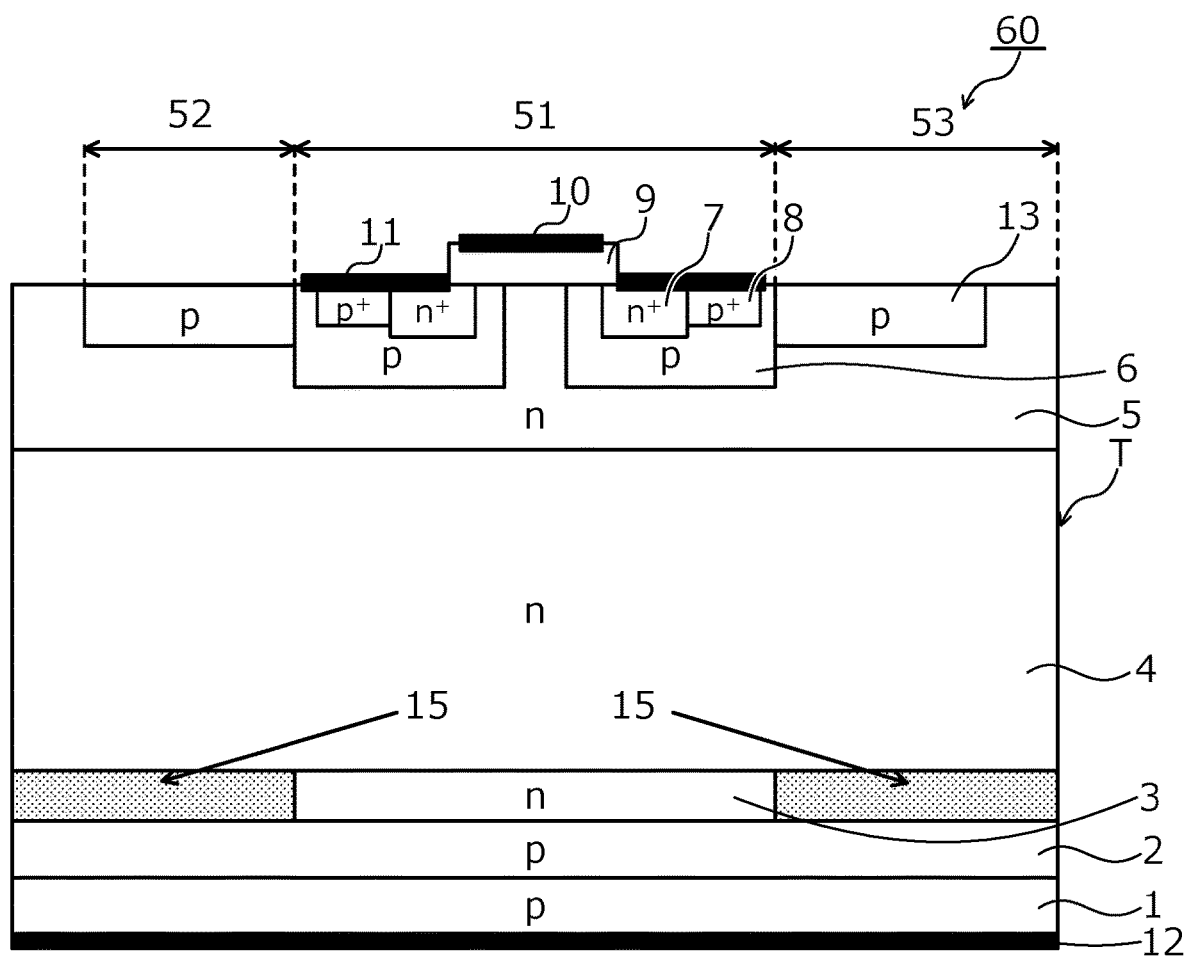
FIG. 10 is a cross-sectional view depicting a structure of a silicon carbide semiconductor device according to a third embodiment.

FIG. 10 is a cross-sectional view depicting a structure of a silicon carbide semiconductor device according to a third embodiment. In the third embodiment, an impurity addition region 15 is provided in an n-type region (the n-type field stop layer 3 or the n-type drift layer 4) in contact with a p-type region (the p-type silicon carbide substrate 1 and the p-type collector layer 2) between the active region 51 and the ends of the termination structure portion 53, the p-type region being closer to the p-type silicon carbide substrate 1 than is the n-type region. FIG. 10 depicts an example in which the impurity addition region 15 is provided in the n-type field stop layer 3. The impurity addition region 15 is formed by an addition of vanadium (V), titanium (Ti), boron (B), nitrogen (N), etc. By providing the impurity addition region 15, inducement of crystal damage by ion implantation, introduction of recombination centers by heterogeneous impurity doping, or by promoting Auger recombination, shortening of the lifetime of carriers at the ends T of the chip is enabled, injection of the carriers (holes) into the end portions of the chip from the p-type collector layer 2 can be suppressed, and expansion of a stacking fault (SF) from an end of the chip can be suppressed. Further, preferably, the density of nitrogen is at least $1\times10^{18}/cm^3$, the density of boron is at least $1\times10^{17}/cm^3$, and the density of vanadium or titanium is at least $1\times10^{14}/cm^3$.

Further, the silicon carbide semiconductor device according to the third embodiment, for example, is formed by an addition of vanadium (V), titanium (Ti), boron (B), nitrogen (N), etc. by ion implantation in the n-type region, after formation of the n-type region that is in contact with the p-type region closer to the p-type silicon carbide substrate 1 than is the n-type region. The thickness of the n-type region is in a range from 0.1 µm to 2 µm.

As described above, according to the third embodiment, the impurity addition region is provided in the n-type region that is in contact with the p-type region that is between the active region and the ends, the p-type region being closer to the p-type silicon carbide substrate than is the n-type region. As a result, the lifetime of carriers at the end portions of the chip can be shortened, injection of carriers (holes) into the end portions from the p-type collector layer 2 can be suppressed, and expansion of a stacking fault (SF) from an end of the chip can be suppressed. Therefore, forward voltage increases can be suppressed.

Figure 11:
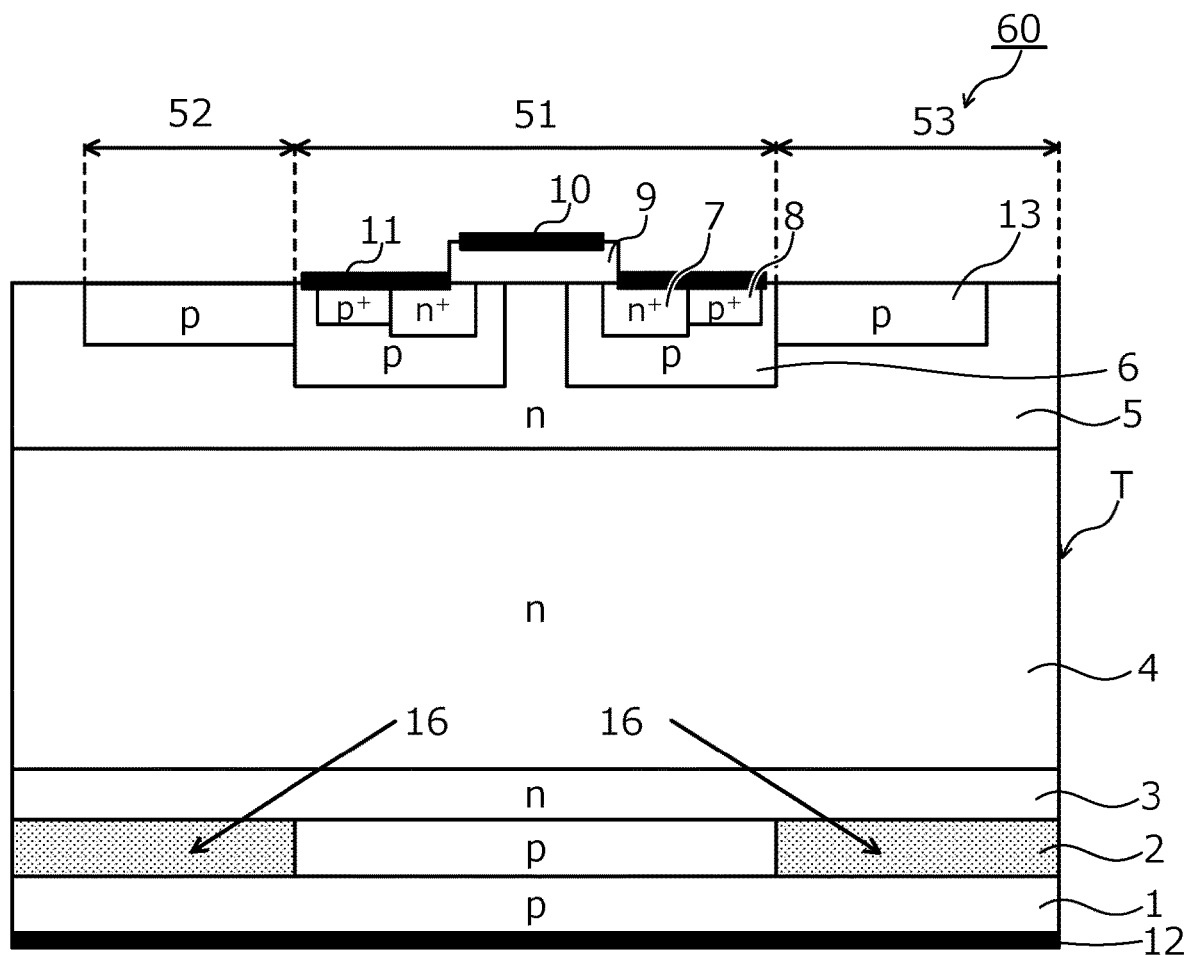
FIG. 11 is a cross-sectional view depicting a structure of a silicon carbide semiconductor device according to a fourth embodiment.

FIG. 11 is a cross-sectional view depicting a structure of a silicon carbide semiconductor device according to a fourth embodiment. In the fourth embodiment, a counter-doped region 16 is provided in a p-type region (the p-type silicon carbide substrate 1 and the p-type collector layer 2) in contact with an n-type region (the n-type field stop layer 3 or the n-type drift layer 4) between the active region 51 and the ends of the termination structure portion 53, on a side of the n-type region facing the p-type silicon carbide substrate 1. FIG. 11 depicts an example in which the counter-doped region 16 is provided in the p-type collector layer 2. The counter-doped region 16 is formed by counter-doping the p-type region with an impurity that becomes a donor, the counter-doped region 16 being a high-resistance region. The counter-doped region 16 is provided, whereby injection of carriers (holes) from the p-type collector layer 2 into the ends T of the chip is suppressed and expansion of a stacking fault (SF) from an end of the chip can be suppressed.

Further, the silicon carbide semiconductor device according to the fourth embodiment, for example, is formed by adding an impurity that is a donor, for example, nitrogen (N), by ion implantation to the p-type region after the p-type region in contact with the n-type region on a side thereof facing the p-type silicon carbide substrate 1 is formed.

As described above, according to the fourth embodiment, the high-resistance counter-doped region is provided in the p-type region that is in contact with the n-type region, on a side of the n-type region facing the p-type silicon carbide substrate, between the active region and the ends. As a result, injection of carrier (holes) into the end portions of the chip from the p-type collector layer 2 can be suppressed and expansion of a stacking fault (SF) from an end of the chip can be suppressed. Therefore, forward voltage increases can be suppressed.

Figure 12:
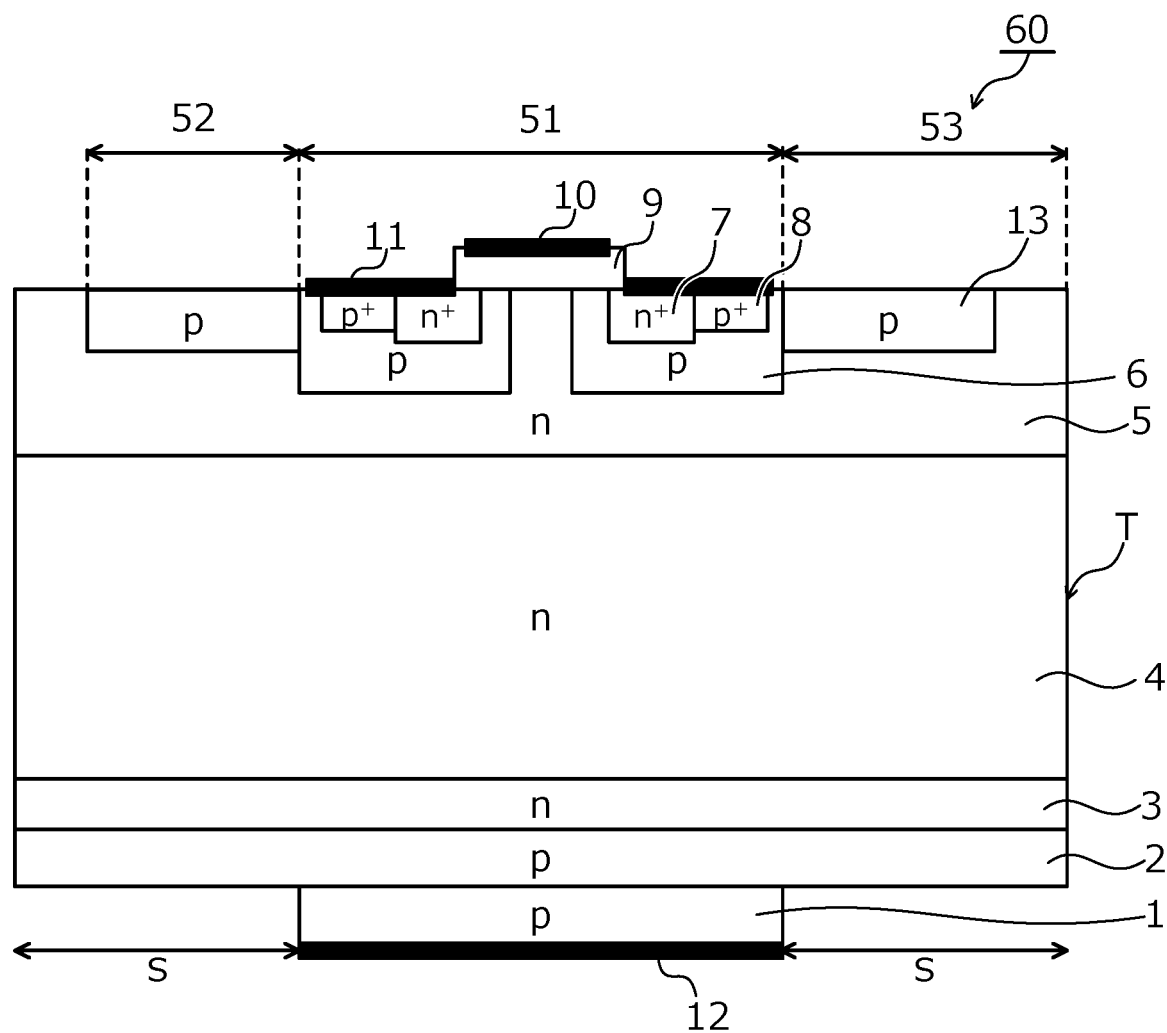
FIG. 12 is a cross-sectional view depicting a structure of a silicon carbide semiconductor device according to a fifth embodiment.

FIG. 12 is a cross-sectional view depicting a structure of a silicon carbide semiconductor device according to a fifth embodiment. In the fifth embodiment, in a region S from the active region 51 to the ends of the termination structure portion 53, the p-type silicon carbide substrate 1 and the collector electrode 12 are removed. As a result, the removed region S does not pass current in the ON state and therefore, injection of carriers (holes) into the ends T of the chip from the p-type silicon carbide substrate 1 can be suppressed and expansion of a stacking fault (SF) from an end of the chip can be suppressed.

Further, the silicon carbide semiconductor device according to the fifth embodiment, for example, can be formed by removing the p-type silicon carbide substrate 1 and the collector electrode 12 of the region S between the active region 51 and the ends T, before dicing of the p-type silicon carbide substrate 1 in which device element structures have been formed.

As described above, according to the fifth embodiment, in the region from the active region to the ends, the p-type silicon carbide substrate and the collector electrode are removed. As a result, in the region, injection of carriers (holes) from the p-type silicon carbide substrate can be suppressed and expansion of a stacking fault (SF) from a side of the chip can be suppressed. Therefore, forward voltage increases can be suppressed.

Figure 13:
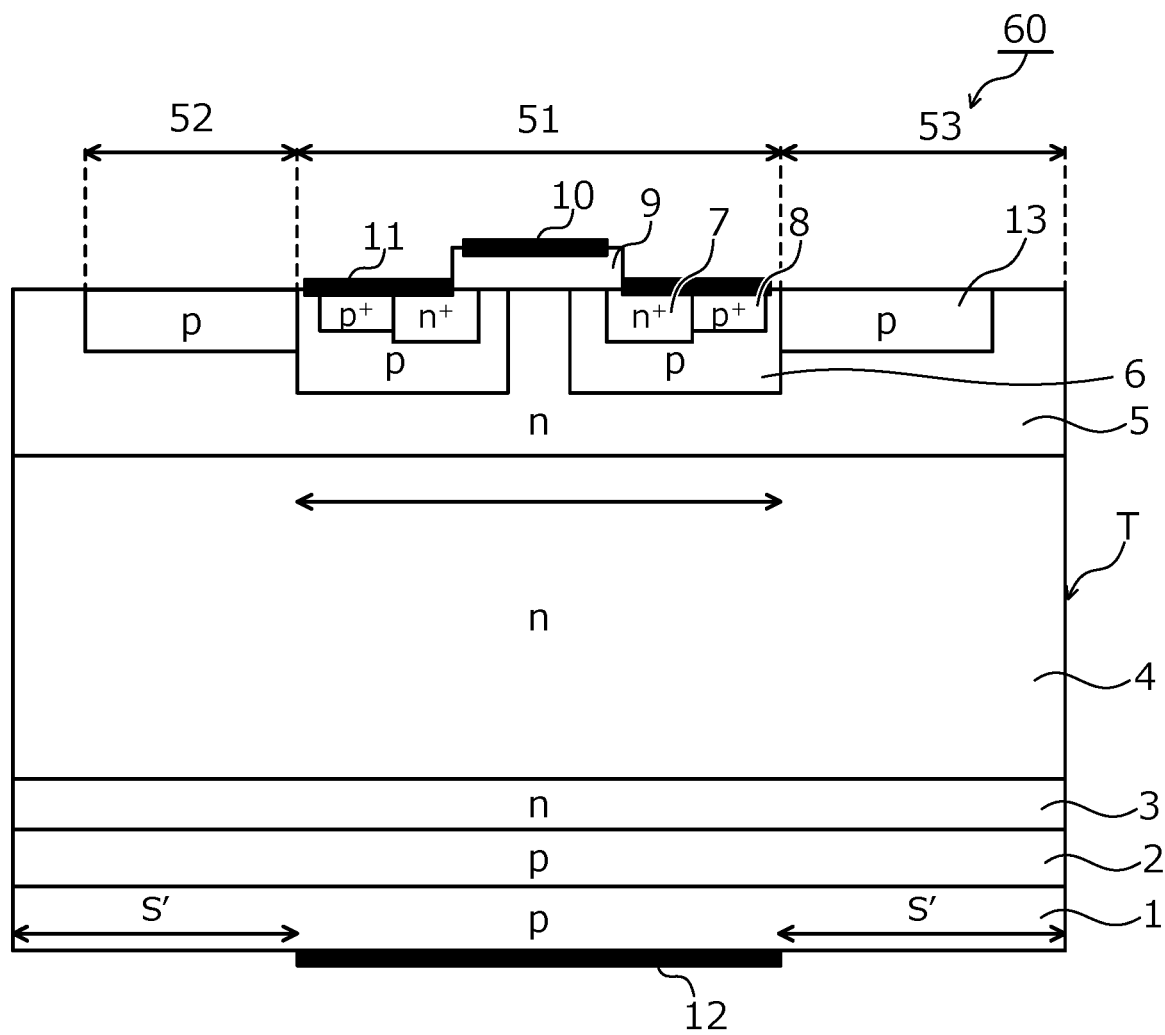
FIG. 13 is a cross-sectional view depicting a structure of a silicon carbide semiconductor device according to a sixth embodiment.

FIG. 13 is a cross-sectional view depicting a structure of a silicon carbide semiconductor device according to a sixth embodiment. In the sixth embodiment, in a region S' from the active region 51 to the ends of the termination structure portion 53, the collector electrode 12 is removed. As a result, the region S' does not pass current in the ON state and therefore, injection of carriers (holes) into the ends T of the chip from the p-type silicon carbide substrate 1 can be suppressed and expansion of a stacking fault (SF) from an end of the chip can be suppressed.

Further, the silicon carbide semiconductor device according to the sixth embodiment can be formed, for example, by forming the collector electrode 12 only in the active region 51, when the collector electrode 12 is formed on the back surface of the p-type silicon carbide substrate 1. Further, formation may also be by removing the collector electrode 12 of the region S' from the active region 51 to the ends T before dicing of the semiconductor substrate (semiconductor chip) 1 in which device element structures have been formed.

Further, in an instance in which the p-type silicon carbide substrate 1 is formed by epitaxial growth as a p-type region, in an area where the collector electrode 12 is formed, ion implantation is performed to form an ohmic contact. This ion implantation is performed only in the active region 51, whereby even when the collector electrode 12 is formed in an entire area of the surface, an effect similar to that of a form in which the collector electrode 12 of the region S' from the active region 51 to the ends T is removed.

As described above, according to the sixth embodiment, in the region from the active region to the ends, the collector electrode is removed. As a result, in the region, injection of carriers (holes) into the end portions of the chip from the p-type silicon carbide substrate can be suppressed and expansion of a stacking fault (SF) from an end of the chip can be suppressed. Therefore, forward voltage increases can be suppressed.

Figure 14:
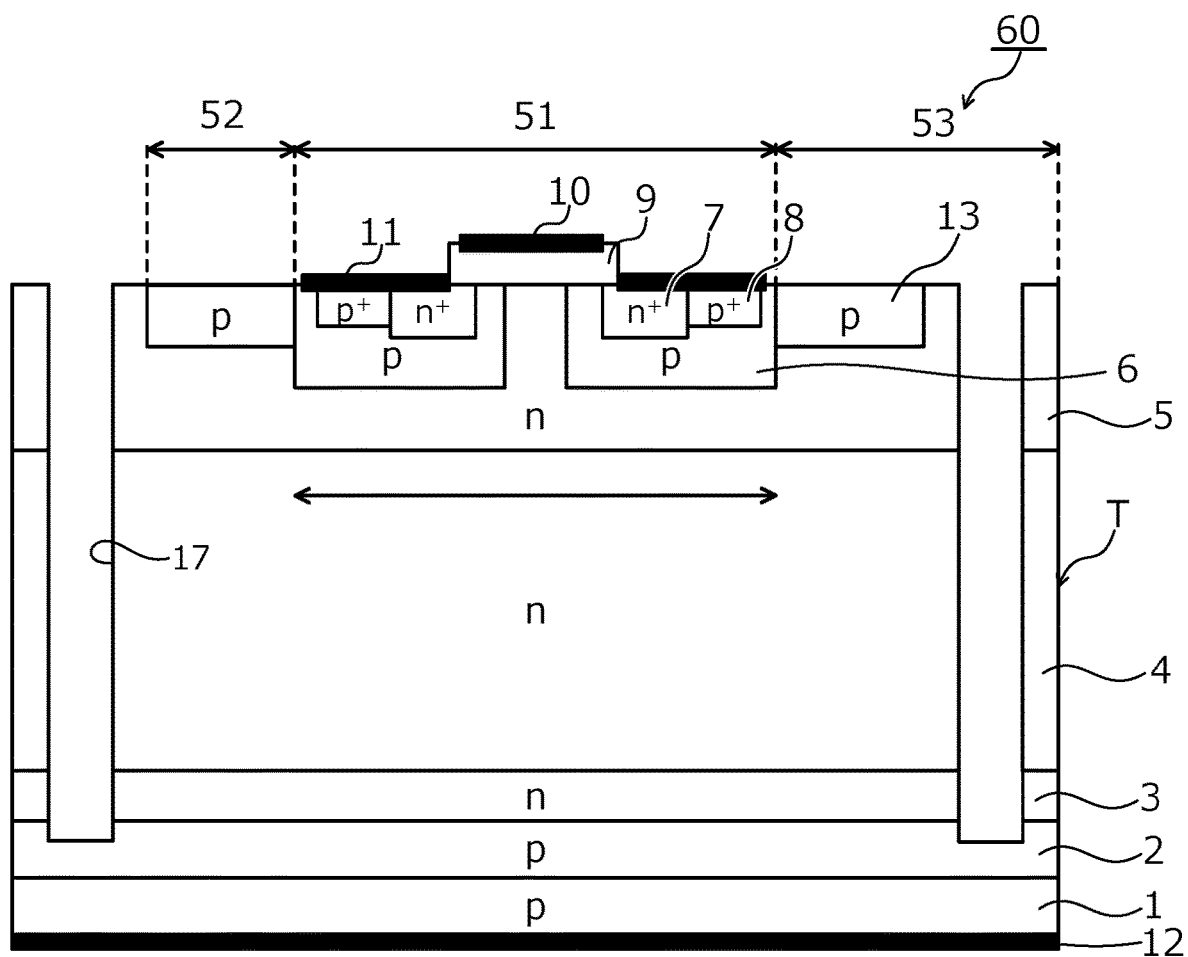
FIG. 14 is a cross-sectional view depicting a structure of a silicon carbide semiconductor device according to a seventh embodiment.

FIG. 14 is a cross-sectional view depicting a structure of a silicon carbide semiconductor device according to a seventh embodiment. In the seventh embodiment, between the active region 51 and the ends of the termination structure portion 53, a beveled mesa 17 penetrating through the n-type carrier accumulating layer 5 (4) and reaching the p-type collector layer 2 is provided. As a result, from the ends T of the silicon carbide semiconductor device, expansion of a linear defect called a basal plane dislocation into a plane defect called a stacking fault and reaching the active region 51 can be prevented.

Further, the silicon carbide semiconductor device according to the seventh embodiment, for example, can be formed by forming the beveled mesa 17 by dry etching after formation of the n-type carrier accumulating layer 5 (4).

As described above, according to the seventh embodiment, the beveled mesa is provided between the active region and the ends. As a result, from the ends of the silicon carbide semiconductor device, expansion of a linear defect called a basal plane dislocation into a plane defect called a stacking fault and reaching the active region can be prevented. Therefore, forward voltage increases can be suppressed.

Figure 15:
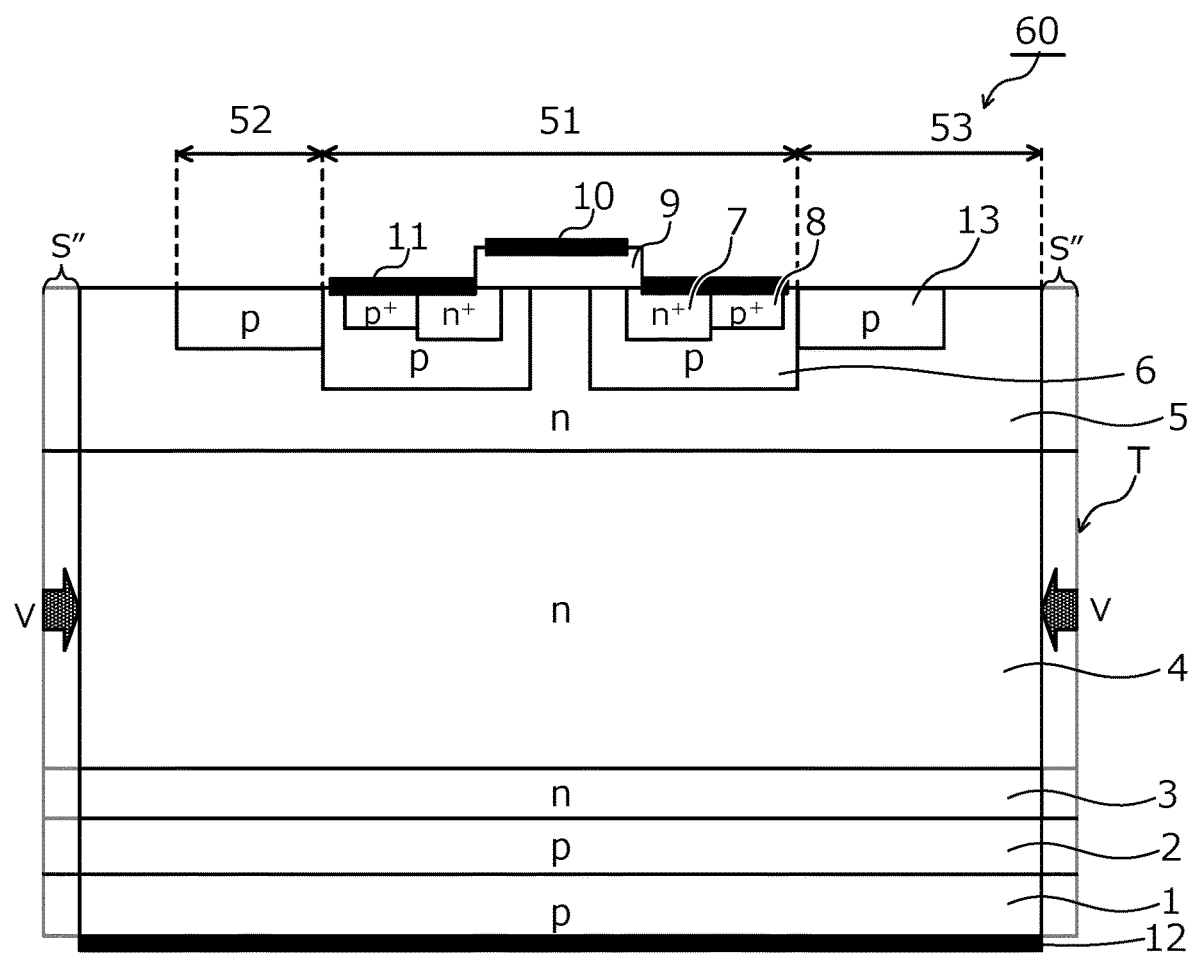
FIG. 15 is a cross-sectional view depicting a structure of a silicon carbide semiconductor device according to an eighth embodiment.

FIG. 15 is a cross-sectional view depicting a structure of a silicon carbide semiconductor device according to an eighth embodiment. In the eighth embodiment, for example, 10 to 30 μm of a predetermined region S" between the active region 51 and the ends of the termination structure portion 53 is removed entirely in a direction of height (thickness) of the p-type silicon carbide substrate 1. As a result, basal plane dislocations present at the ends T are removed, expansion of a linear defect called a basal plane dislocation into a plane defect called a stacking fault and reaching the active region 51 can be prevented.

Further, the silicon carbide semiconductor device according to the eighth embodiment can be formed by removing the predetermined region S" between the active region 51 of the p-type silicon carbide substrate 1 and the ends of the termination structure portion 53 by dry etching, after, for example, the semiconductor substrate (semiconductor chip) 1 in which the device element structures are formed is diced.

As described above, according to the eighth embodiment, the predetermined region from the ends to the active region are removed entirely in the height (thickness) direction of the p-type silicon carbide substrate. As a result, basal plane dislocations present at the ends are removed and expansion of linear faults called basal plane dislocations into plan defects called stacking faults and reaching the active region can be prevented. Therefore, forward voltage increases can be suppressed.

Figure 16:
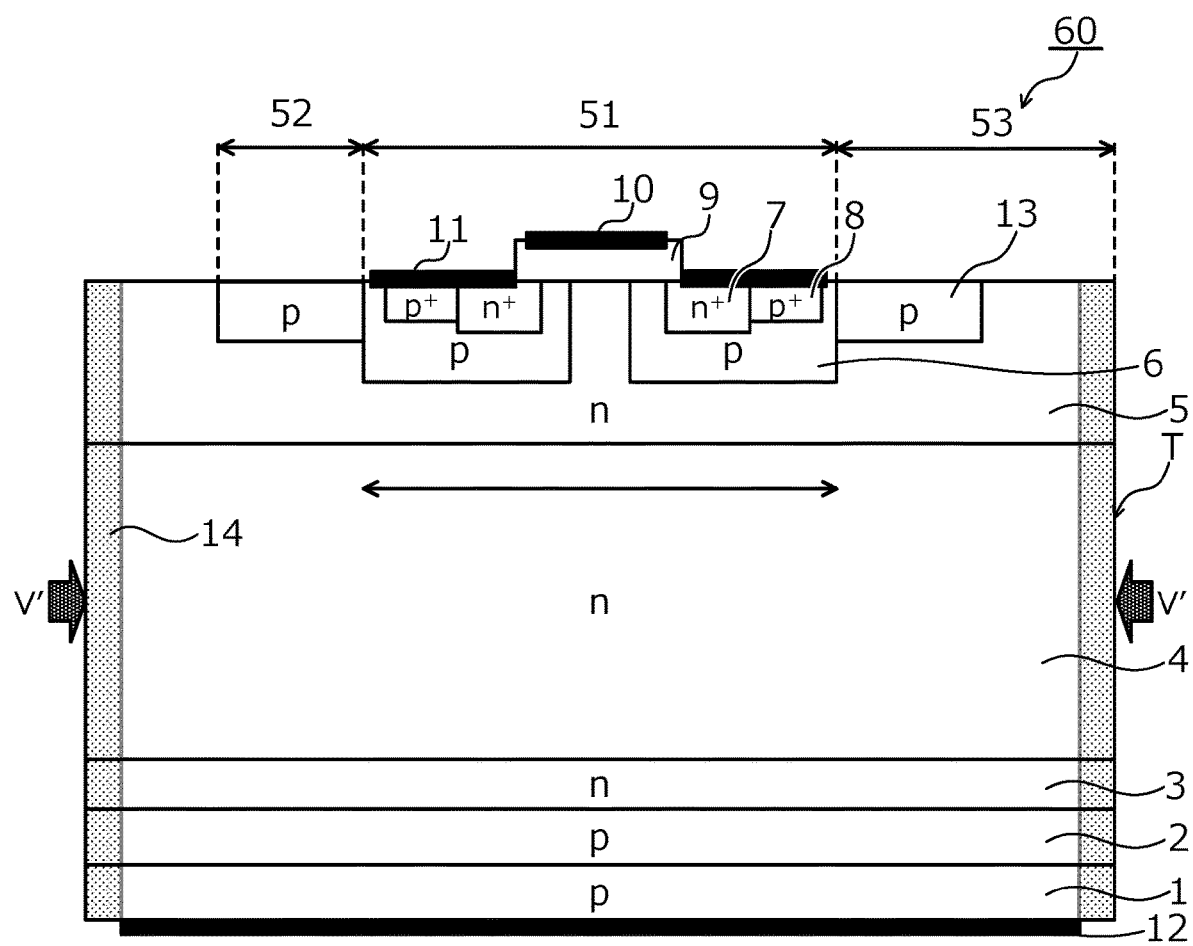
FIG. 16 is a cross-sectional view depicting a structure of a silicon carbide semiconductor device according to a ninth embodiment.

FIG. 16 is a cross-sectional view depicting a structure of a silicon carbide semiconductor device according to a ninth embodiment. In the ninth embodiment, the low-lifetime region 14 is provided in an entire area in the height (thickness) direction of the p-type silicon carbide substrate 1, between the active region 51 and the ends of the termination structure portion 53. In the low-lifetime region 14, damage is induced in the crystal structure by proton ($H^+$) irradiation. By providing the low-lifetime region 14, the carrier lifetime at the ends T of the chip can be shortened, injection of carriers (holes) into the end portions of the chip can be suppressed, and expansion of a stacking fault (SF) from an end of the chip can be suppressed.

Further, in the silicon carbide semiconductor device according to the ninth embodiment, for example, after the p-type silicon carbide substrate 1 in which device element structures have been formed is diced, the low-lifetime region 14 can be formed by irradiating protons ($H^+$) from a side surface (arrow V' side in FIG. 16) into the region that is from the active region 51 of the p-type silicon carbide substrate 1 to the ends T.

As described above, according to the ninth embodiment, the low-lifetime region is provided from the active region to the ends. As a result, the lifetime of the carriers at the end portions of the chip can be shortened, injection of carriers (holes) into the end portions of the chip can be suppressed, and expansion of a stacking fault (SF) from an end of the chip can be suppressed. Therefore, forward voltage increases can be suppressed.

Figure 17:
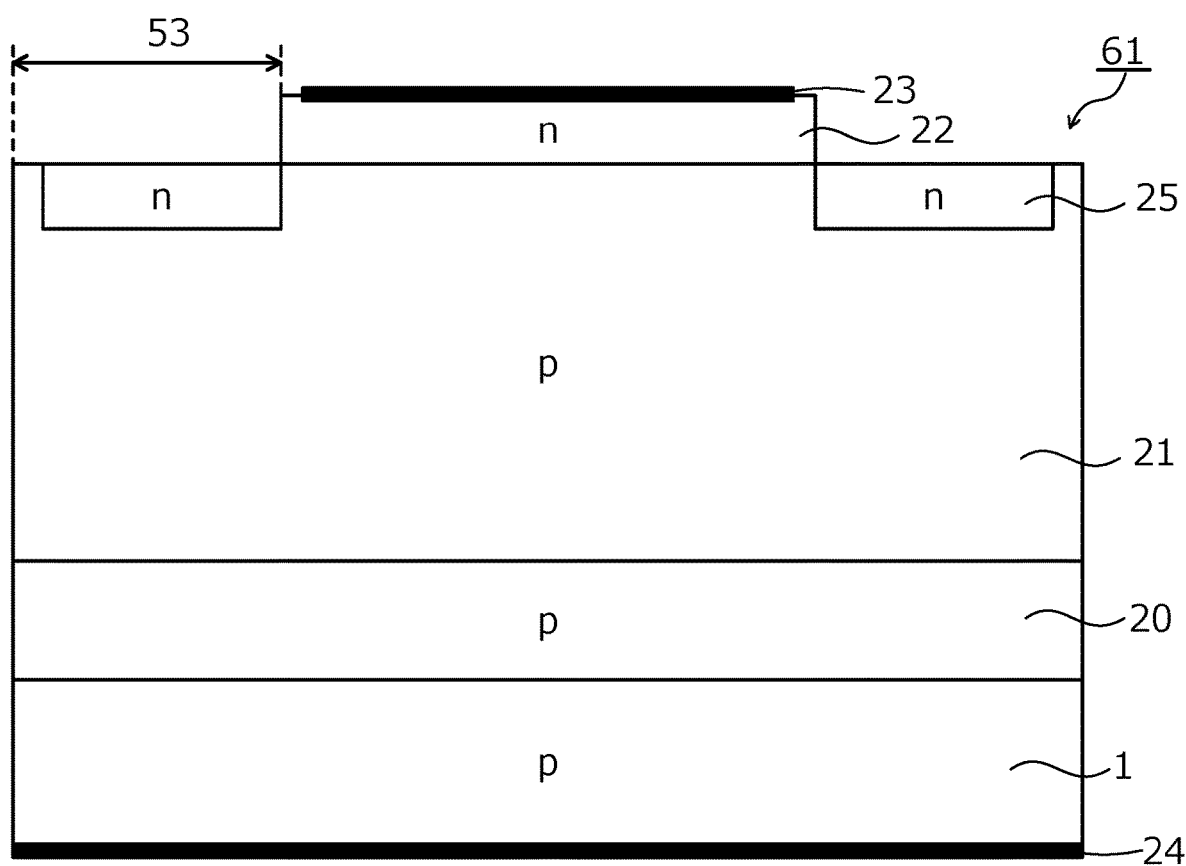
FIG. 17 is cross-sectional view depicting another structure of a silicon carbide semiconductor device according to the first to the ninth embodiments.
Figure 18:
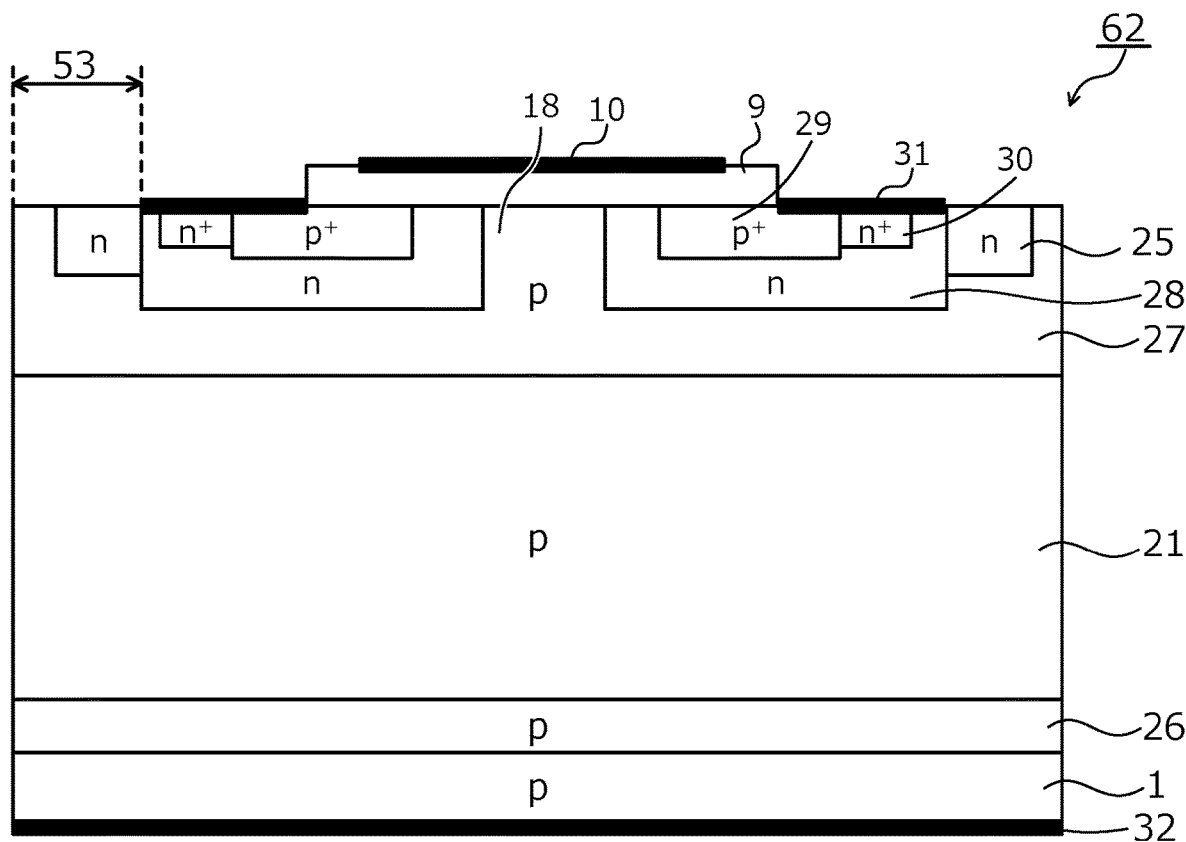
FIG. 18 is cross-sectional view depicting another structure of a silicon carbide semiconductor device according to the first to the ninth embodiments.
Figure 19:
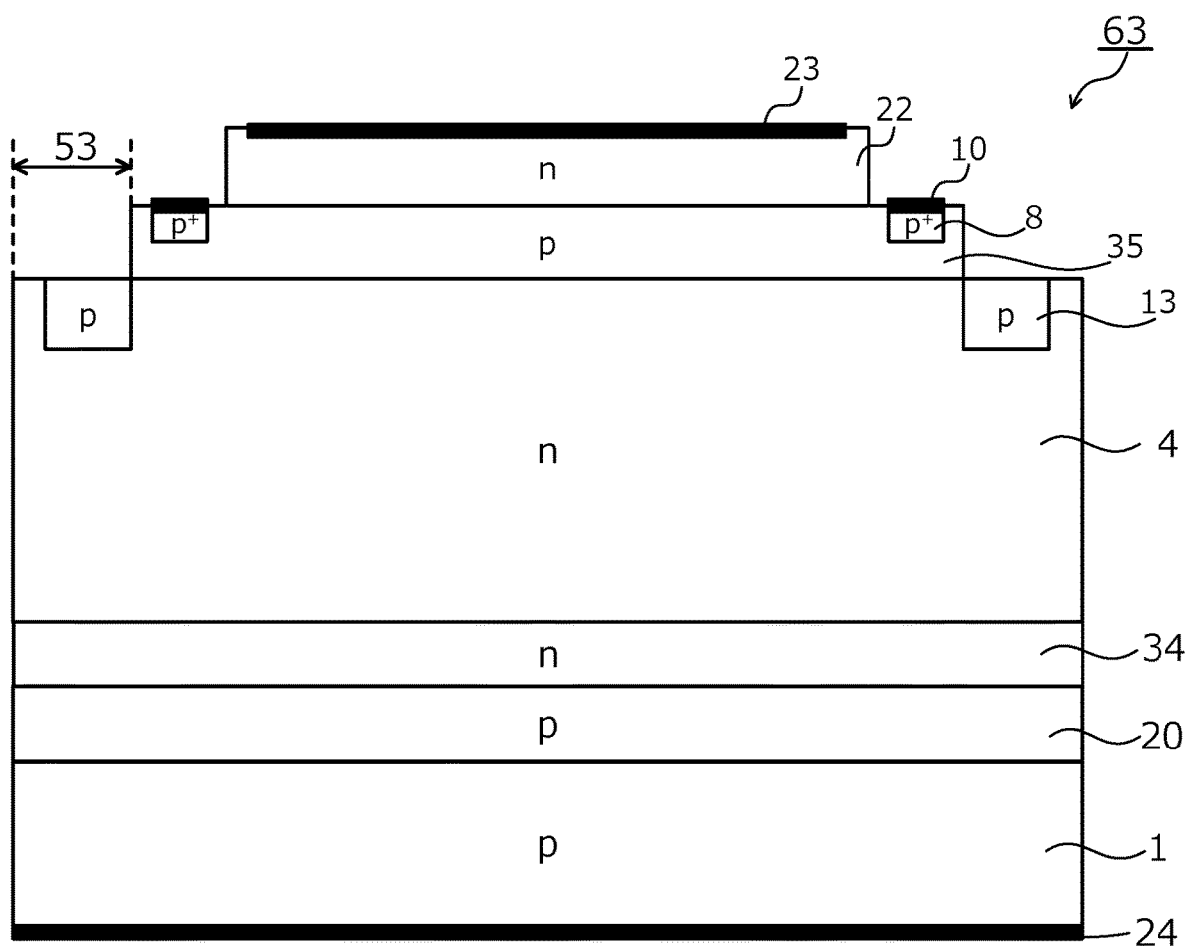
FIG. 19 is cross-sectional view depicting another structure of a silicon carbide semiconductor device according to the first to the ninth embodiments.
Figure 20:
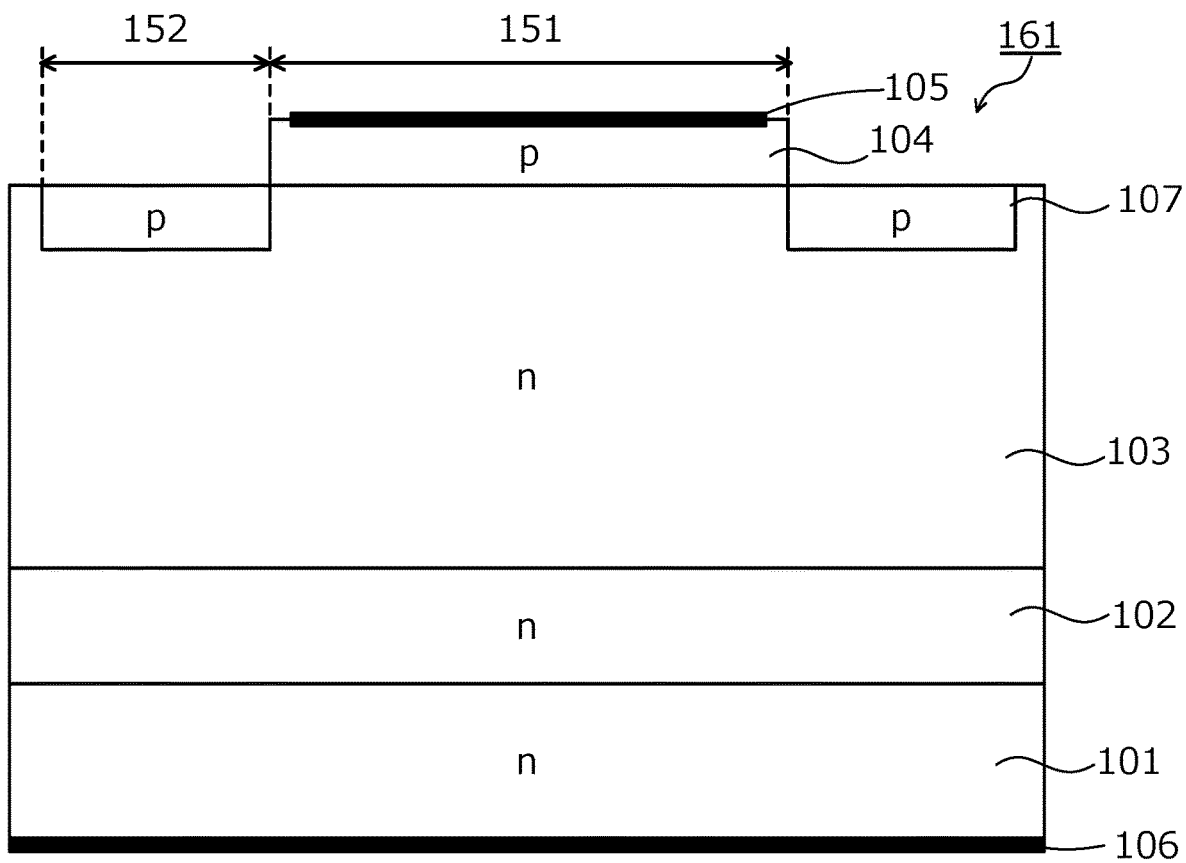
FIG. 20 is a cross-sectional view depicting a structure of a conventional bipolar semiconductor device having an n-type semiconductor substrate.
Figure 21:
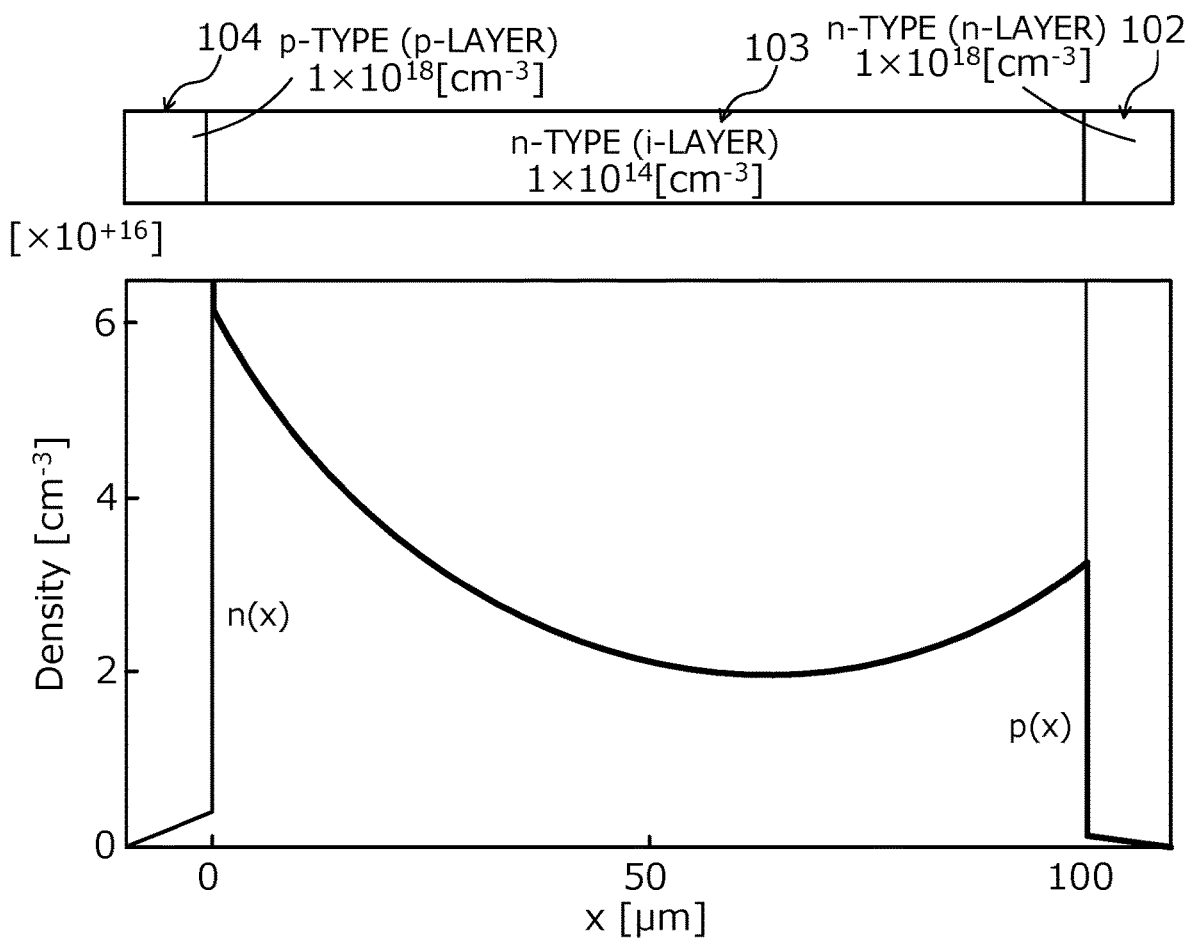
FIG. 21 is a graph depicting distribution of carriers in a drift layer of the conventional bipolar semiconductor device having the n-type semiconductor substrate.
Figure 22:
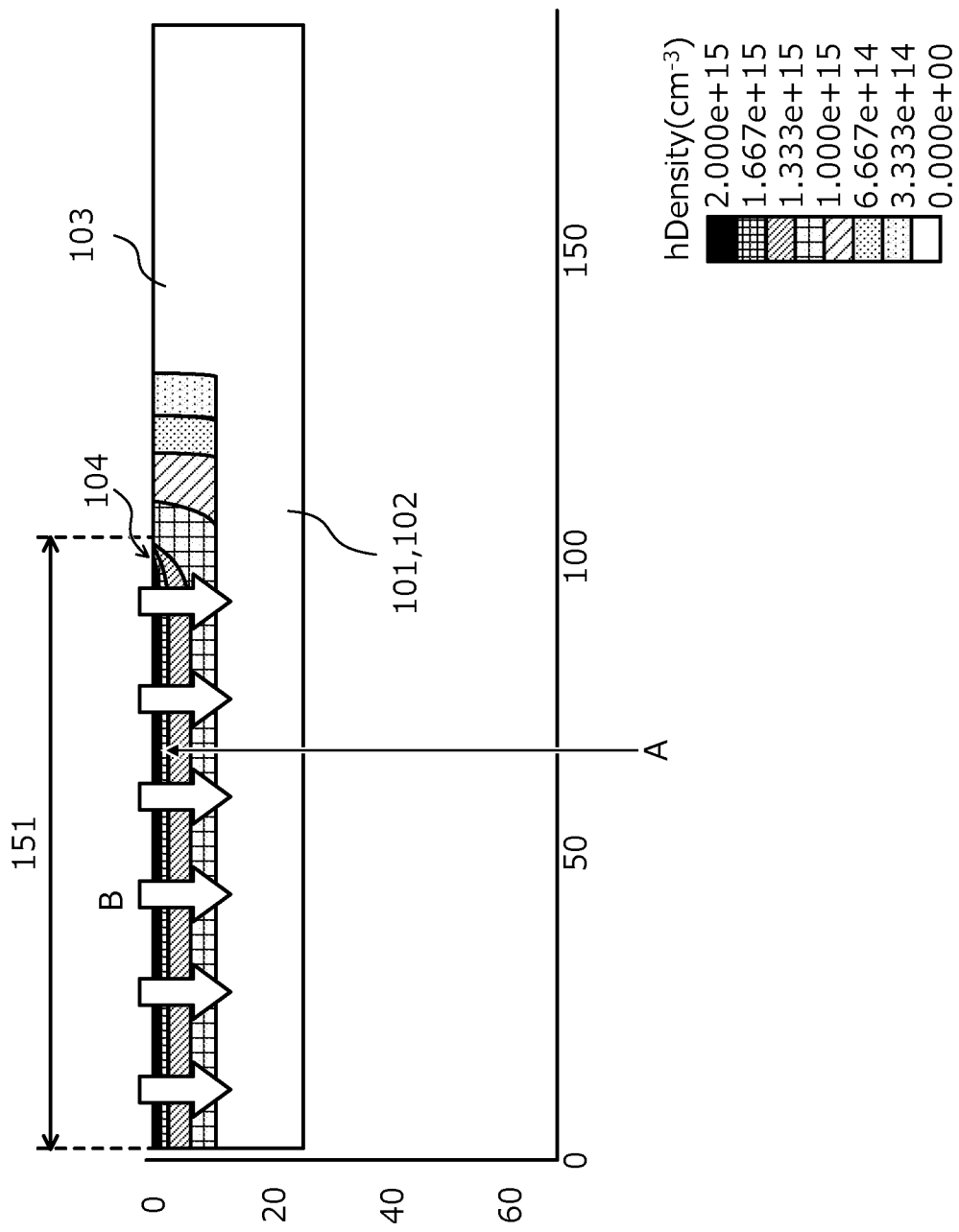
FIG. 22 is a cross-sectional view depicting distribution of carriers in the drift layer of the conventional bipolar semiconductor device having the n-type semiconductor substrate.

In the foregoing, in the first to the ninth embodiments, while the n-channel silicon carbide IGBT 60 is described as an example, the first to the ninth embodiments can be applied to silicon carbide semiconductor devices having another structure. FIGS. 17, 18, and 19 are cross-sectional views depicting other structures of a silicon carbide semiconductor device according to the first to the ninth embodiments.

FIG. 17 depicts an example of a PiN diode 61. The PiN diode 61, as depicted in FIG. 17 is configured using a silicon carbide wafer in which a p-type buffer layer 20, a p-type drift layer 21, and an n-type cathode layer 22 are sequentially stacked by epitaxial growth on the front surface of the p-type silicon carbide substrate 1. A cathode electrode 23 is provided on the n-type cathode layer 22 and an anode 24 is provided on the back surface.

The n-type cathode layer 22 is provided only in the active region through which current passes in the ON state and is not provided in the termination structure portion 53. In the termination structure portion 53, for example, a voltage withstanding structure is disposed constituted by n-type termination regions 25 that have differing impurity concentrations and that are disposed in ascending order of impurity concentration from an outer side (side surface of the semiconductor substrate).

FIG. 18 depicts an example of a MOSFET 62. As depicted in FIG. 18, the MOSFET 62 is configured using a silicon carbide wafer in which a p-type field stop layer 26, the p-type drift layer 21, and a p-type carrier accumulating layer 27 are sequentially stacked by epitaxial growth on the front surface of the p-type silicon carbide substrate 1. In the p-type carrier accumulating layer 27, n-type base regions 28 are provided. Further, in the n-type base regions 28, $p^+$-type source regions 29 and $n^+$-type contact regions are provided. In the n-type base regions 28, the JFET region 18 of a p-type is provided penetrating through the n-type base regions 28 in the depth direction and reaching the p-type carrier accumulating layer 27.

Further, the gate insulating film 9 is provided spanning the surfaces of the n-type base regions 28 and the $p^+$-type source regions 29. On the surface of the gate insulating film 9, the gate electrode 10 is provided and the interlayer insulating film (not depicted) is provided so as to cover the gate electrode 10. On the front side of the silicon carbide wafer, source electrodes 31 are provided in contact with the $p^+$-type source regions 29 and the $n^+$-type contact regions 30, source wiring (not depicted) is provided on the source electrodes 31, and a protective film (not depicted) is provided on the source wiring. Further, the drain electrode 32 is provided on the back surface.

The n-type base regions 28 and the JFET region 18 are provided only in the active region through which current passes during the ON state and are not provided in the termination structure portion 53. In the termination structure portion 53, for example, a voltage withstanding structure is disposed constituted by the n-type termination regions 25 that have differing impurity concentrations and that are disposed in ascending order of impurity concentration from an outer side (side surface of the semiconductor substrate).

FIG. 19 depicts an example of a thyristor 63. Further, a GTO, a GCT (gate commutated turn-off thyristor), etc. are similar hereto. As depicted in FIG. 19, the thyristor 63 is configured using a silicon carbide wafer in which, the p-type buffer layer 20, an n-type buffer layer 34, the n-type drift layer 4, a p-type gate layer 35, and the n-type cathode layer 22 are sequentially stacked by epitaxial growth on the front surface of the p-type silicon carbide substrate 1. The $p^+$-type contact regions 8 are provided in the p-type gate layer 35 and the $p^+$-type contact regions 8 are exposed in contact holes that penetrate through the n-type cathode layer 22 in the depth direction.

Further, the gate electrodes 10 are provided on the surfaces of the $p^+$-type contact regions 8, and the interlayer insulating film (not depicted) is provided so as to cover the gate electrodes 10. On the front side of the silicon carbide wafer, the cathode electrode 23 is provided in contact with the n-type cathode layer. Further, an anode electrode 24 is provided on the back surface.

The p-type gate layer 35 is provided only in the active region through which current passes in the ON state and is not provided in the termination structure portion 53. In the termination structure portion 53, for example, a voltage withstanding structure constituted by the p-type termination regions 13 that have differing impurity concentrations and that are disposed in ascending order of impurity concentration from an outer side (side surface of the semiconductor substrate).

In the foregoing, the present invention may be variously changed within a range not departing from the spirit of the invention and, for example, in the embodiments described above, dimensions, impurity concentrations, etc. of parts are variously set according to necessary specifications.

According to the invention described above, carrier density at chip ends is at most a threshold $1\times10^{15}/\text{cm}^3$ at which a stacking fault (SF) expands. As a result, during semiconductor chip bipolar operation, the expansion of a stacking fault (SF) from the chip ends can be suppressed. As a result, forward voltage increases can be suppressed.

The silicon carbide semiconductor device and the method of manufacturing a silicon carbide semiconductor device achieve an effect in that in a bipolar silicon carbide semiconductor device element that uses a p-type semiconductor substrate, recombination of carriers of device element ends is reduced and forward voltage increases can be suppressed.

As described above, the silicon carbide semiconductor device and the method of manufacturing a silicon carbide semiconductor device according to the present invention are useful for power semiconductor devices used in power converting equipment such as inverters, power source devices such as those of various types of industrial machines, and automobile igniters, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having an active region through which a current passes, and a termination structure portion disposed outside of the active region and in which a voltage withstanding structure surrounding a periphery of the active region is formed, the silicon carbide semiconductor device comprising:

a semiconductor substrate of a second conductivity type, having a first main surface and a second main surface opposite to each other;
a first semiconductor layer of the second conductivity type, provided on the first main surface of the semiconductor substrate;
a second semiconductor layer of a first conductivity type, provided on a surface of the first semiconductor layer, at a side thereof opposite to a side facing the semiconductor substrate;
a plurality of first semiconductor regions of the second conductivity type, provided in a surface layer of the second semiconductor layer, at a side thereof opposite to a side facing the semiconductor substrate;
a plurality of second semiconductor regions of the first conductivity type, provided in surface layers of the first semiconductor regions, at sides thereof opposite to sides facing the semiconductor substrate, the second semiconductor regions having an impurity concentration higher than that of the second semiconductor layer;
a gate insulating film provided on surfaces of regions of the first semiconductor regions, between the second semiconductor layer and the second semiconductor regions;
a gate electrode provided on the gate insulating film;
a first electrode in contact with the first semiconductor regions and the second semiconductor regions; and
a second electrode provided on the second main surface of the semiconductor substrate, wherein
during bipolar operation of the silicon carbide semiconductor device, a smaller density as between an electron density and a hole density of the second semiconductor layer in the termination structure portion at an end thereof is at most $1\times10^{15}/\text{cm}^3$, the end of the termination structure portion being located at a side opposite to a side where the active region is provided.

2. The silicon carbide semiconductor device according to claim 1, wherein during the bipolar operation, the hole density of the second semiconductor layer in the termination structure portion at the end thereof is at most $1\times10^{15}/\text{cm}^3$.

3. The silicon carbide semiconductor device according to claim 1, wherein a distance from the active region to the end of the termination structure portion is at least 1.2 mm.

4. The silicon carbide semiconductor device according to claim 1, wherein
a distance from the active region to the end of the termination structure portion, in a direction orthogonal to an off-angle of the semiconductor substrate is at least 1.2 mm.

5. The silicon carbide semiconductor device according to claim 1, wherein
a low-lifetime region is provided from the active region to the end of the termination structure portion.

6. The silicon carbide semiconductor device according to claim 1, wherein
a low-lifetime region is provided from the active region to the end of the termination structure portion, in a direction orthogonal to an off-angle of the semiconductor substrate.

7. The silicon carbide semiconductor device according to claim 1, further comprising
a third semiconductor layer of the first conductivity type, provided between the first semiconductor layer and the second semiconductor layer, the third semiconductor layer having an impurity concentration higher than that of the second semiconductor layer, wherein the third semiconductor layer in the termination structure portion contains vanadium, titanium, boron, or nitrogen as an additive.

8. The silicon carbide semiconductor device according to claim 7, wherein
the third semiconductor layer in the termination structure portion contains nitrogen, a density of which is at least $1\times10^{18}/cm^3$, boron, a density of which is at least $1\times10^{17}/cm^3$, or one of vanadium or titanium, a density of which is at least $1\times10^{14}/cm^3$.

9. The silicon carbide semiconductor device according to claim 8, wherein
the third semiconductor layer has a thickness in a range from 0.1 μm to 2 μm.

10. The silicon carbide semiconductor device according to claim 1, further comprising
a third semiconductor layer of the first conductivity type, provided between the first semiconductor layer and the second semiconductor layer, the third semiconductor layer having an impurity concentration higher than that of the second semiconductor layer, wherein
the third semiconductor layer in the termination structure portion contains damage at multiple locations in a crystal structure thereof.

11. The silicon carbide semiconductor device according to claim 1, wherein
the first semiconductor layer in the termination structure portion contains nitrogen as an additive.

12. The silicon carbide semiconductor device according to claim 1, wherein
the semiconductor substrate and the second electrode are provided only in the active region.

13. The silicon carbide semiconductor device according to claim 1, wherein
the second electrode is provided only in the active region.

14. The silicon carbide semiconductor device according to claim 1, wherein
the termination structure portion has a groove reaching the first semiconductor layer, from a surface of the second semiconductor layer, at the side thereof opposite to the side facing the semiconductor substrate.

15. The silicon carbide semiconductor device according to claim 1, further comprising a predetermined region located between the end of the termination structure portion and the active region, the predetermined region being free of basal plane dislocations.

16. The silicon carbide semiconductor device according to claim 1, further comprising a predetermined region located between the end of the termination structure portion and the active region, the predetermined region containing damage at multiple locations in a crystal structure thereof.

17. The silicon carbide semiconductor device according to claim 1, wherein the end of the termination structure portion forms an outer peripheral surface of the silicon carbide semiconductor device.

18. The silicon carbide semiconductor device according to claim 17, wherein the first semiconductor layer and the second semiconductor layer extend to reach the end of the termination structure portion to form the outer peripheral surface of the silicon carbide semiconductor device.

19. A method of manufacturing a silicon carbide semiconductor device having an active region through which a current passes, and a termination structure portion disposed outside of the active region and in which a voltage withstanding structure surrounding a periphery of the active region is formed, the method comprising:
forming a first semiconductor layer of a second conductivity type on a first main surface of a semiconductor substrate of the second conductivity type;
forming a second semiconductor layer of a first conductivity type on a surface of the first semiconductor layer, on a side thereof opposite to a side facing the semiconductor substrate;
forming a plurality of first semiconductor regions of the second conductivity type in a surface layer of the second semiconductor layer, on a side thereof opposite to a side facing the semiconductor substrate;
forming a plurality of second semiconductor regions of the first conductivity type in surface layers of the first semiconductor regions, on sides thereof opposite to sides facing the semiconductor substrate, each of the second semiconductor regions having an impurity concentration higher than that of the second semiconductor layer;
forming a gate insulating film on surfaces of regions of the first semiconductor regions, between the second semiconductor layer and the second semiconductor regions;
forming a gate electrode on the gate insulating film;
forming a first electrode in contact with the first semiconductor regions and the second semiconductor regions; and
forming a second electrode on a second main surface opposite to the first main surface of the semiconductor substrate, wherein
the second semiconductor layer in the termination structure portion is formed having a hole density that is at most $1\times10^{15}/cm^3$ at an end thereof, the end of the termination structure portion being located at a side opposite to a side where the active region is provided.

20. The method of manufacturing a silicon carbide semiconductor device according to claim 19, further comprising
removing a predetermined region located between the end of the termination structure portion and the active region, by dry etching after forming the second electrode.

* * * * *